(12) United States Patent
Kim et al.

(10) Patent No.: US 11,973,111 B2
(45) Date of Patent: Apr. 30, 2024

(54) SEMICONDUCTOR DEVICES AND METHODS FOR FABRICATING THE SAME

(71) Applicant: Samsung Electronics Co., Ltd., Suwon-si (KR)

(72) Inventors: Mun Hyeon Kim, Hwaseong-si (KR); Kern Rim, Suwon-si (KR); Dae Won Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 17/509,646

(22) Filed: Oct. 25, 2021

(65) Prior Publication Data
US 2022/0285493 A1   Sep. 8, 2022

(30) Foreign Application Priority Data
Mar. 3, 2021   (KR) .................... 10-2021-0028003

(51) Int. Cl.
*H01L 29/06* (2006.01)
*H01L 21/8234* (2006.01)
*H01L 29/66* (2006.01)
*H01L 29/78* (2006.01)
*H01L 29/786* (2006.01)

(52) U.S. Cl.
CPC .. *H01L 29/0665* (2013.01); *H01L 21/823418* (2013.01); *H01L 29/66545* (2013.01); *H01L 29/66553* (2013.01); *H01L 29/7845* (2013.01); *H01L 29/78618* (2013.01)

(58) Field of Classification Search
CPC ......... H01L 21/02603; H01L 21/28141; H01L 21/823418; H01L 21/823431; H01L 21/823821; H01L 21/845; H01L 27/0886; H01L 27/0924; H01L 27/1211; H01L 29/0653; H01L 29/0665; H01L 29/0669; H01L 29/0673; H01L 29/41791; H01L 29/42392; H01L 29/66439; H01L 29/6653; H01L 29/66553; H01L 29/6656; H01L 29/66545; H01L 29/66795; H01L 29/775; H01L 29/7845; H01L 29/785; H01L 29/7851; H01L 29/7853; H01L 29/7855; H01L 29/78618; H01L 2029/7858

See application file for complete search history.

(56) References Cited

U.S. PATENT DOCUMENTS

| | | | |
|---|---|---|---|
| 9,653,462 B2 | 5/2017 | Suk et al. | |
| 9,741,812 B1 | 8/2017 | Adusumilli et al. | |
| 10,199,471 B2 | 2/2019 | Choi et al. | |

(Continued)

*Primary Examiner* — David C Spalla
(74) *Attorney, Agent, or Firm* — Myers Bigel, P.A.

(57) ABSTRACT

A semiconductor device is provided. The semiconductor device includes a substrate, an active pattern extending in a first horizontal direction on the substrate, a gate electrode extending in a second horizontal direction different from the first horizontal direction on the active pattern, a source/drain region on at least one side of the gate electrode, a source/drain contact extending into the source/drain region and including a filling layer and a barrier layer along a sidewall of the filling layer, and a silicide layer between the source/drain region and the filling layer, the silicide layer including a first sidewall in contact with the filling layer and a second sidewall in contact with the source/drain region, wherein the barrier layer is not between the filling layer and the source/drain region.

20 Claims, 27 Drawing Sheets

(56) References Cited

U.S. PATENT DOCUMENTS

| | | | |
|---|---|---|---|
| 10,276,675 B2 | 4/2019 | Choi et al. | |
| 10,340,355 B2 | 7/2019 | Adusumilli et al. | |
| 10,355,000 B2 | 7/2019 | Choi et al. | |
| 10,522,622 B2 | 12/2019 | Cheng et al. | |
| 10,553,492 B2 | 2/2020 | Chang et al. | |
| 10,672,764 B2 | 6/2020 | Kim et al. | |
| 10,714,387 B2 | 7/2020 | Joe et al. | |
| 10,714,578 B2 | 7/2020 | Huang | |
| 10,714,579 B2 | 7/2020 | Lee et al. | |
| 2018/0286861 A1* | 10/2018 | Choi | H01L 21/76831 |
| 2019/0181224 A1* | 6/2019 | Zhang | H01L 29/66553 |
| 2019/0333820 A1* | 10/2019 | Chang | H01L 21/76843 |
| 2020/0266271 A1* | 8/2020 | Lin | H01L 21/02603 |
| 2021/0305393 A1* | 9/2021 | Wang | H01L 29/78618 |
| 2022/0028786 A1* | 1/2022 | Huang | H01L 27/0886 |

* cited by examiner

SEMICONDUCTOR DEVICES AND METHODS FOR FABRICATING THE SAME

CROSS-REFERENCE TO RELATED APPLICATION

This application claims priority from Korean Patent Application No. 10-2021-0028003 filed on Mar. 3, 2021 in the Korean Intellectual Property Office, and all the benefits accruing therefrom under 35 U.S.C. 119, the contents of which in its entirety are herein incorporated by reference.

BACKGROUND

The present disclosure relates to semiconductor devices, such as a semiconductor device including a Multi-Bridge Channel Field Effect Transistor (MBCFET™). Among scaling techniques for increasing the density of semiconductor devices, a multi-gate transistor has been proposed, in which a fin- or nanowire-shaped silicon body is formed on a substrate and a gate is formed on the surface of the silicon body.

Since the multi-gate transistor uses a three-dimensional (3D) channel, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

SUMMARY

Aspects of the present disclosure provide a semiconductor device and a method for fabricating the semiconductor device, in which interfacial resistance is reduced/minimized by increasing the area of a boundary surface between a source/drain region and a source/drain contact.

Aspects of the present disclosure also provide a semiconductor device and a method for fabricating the semiconductor device, in which a source/drain contact is formed after removing a sacrificial layer formed on a source/drain region, thereby inhibiting/preventing the source/drain region from protruding in a lateral direction. Accordingly, the reliability of the semiconductor device may be improved by lowering the driving power of the semiconductor device.

According to an example embodiment of the present disclosure, there is provided a semiconductor device, comprising a substrate, an active pattern extending in a first horizontal direction on the substrate, a gate electrode extending in a second horizontal direction different from the first horizontal direction on the active pattern, a source/drain region on at least one side of the gate electrode, a source/drain contact extending into the source/drain region and including a filling layer and a barrier layer along a sidewall of the filling layer, and a silicide layer between the source/drain region and the filling layer, the silicide layer including a first sidewall in contact with the filling layer and a second sidewall in contact with the source/drain region, wherein the barrier layer is not between the filling layer and the source/drain region.

According to an example embodiment of the present disclosure, there is provided a semiconductor device, comprising a substrate, an active pattern extending in a first horizontal direction on the substrate, a plurality of nanosheets stacked to be spaced apart from each other in a vertical direction on the active pattern, a gate electrode extending in a second horizontal direction different from the first horizontal direction on the active pattern and surrounding the plurality of nanosheets, a source/drain region on at least one side of the gate electrode, a source/drain contact extending into the source/drain region and including a filling layer and a barrier layer along a sidewall of the filling layer, a silicide layer between the source/drain region and the filling layer, including a first sidewall in contact with the filling layer and a second sidewall in contact with the source/drain region, and having an uppermost surface in contact with the barrier layer, an interlayer insulating layer on a sidewall of the source/drain contact, and a liner layer between the source/drain contact and the gate electrode and between the source/drain contact and the interlayer insulating layer, wherein the barrier layer includes a first sidewall in contact with the filling layer and a second sidewall opposite to the first sidewall, and the first sidewall of the barrier layer extends from the first sidewall of the silicide layer.

According to an example embodiment of the present disclosure, there is provided a method for fabricating a semiconductor device, comprising forming a stacked structure in which a first semiconductor layer and a second semiconductor layer are alternately stacked on a substrate, forming a dummy gate on the stacked structure, forming a trench by etching the stacked structure using the dummy gate as a mask, forming a source/drain region in the trench, forming a sacrificial layer on the source/drain region in the trench, forming a liner material layer on a sidewall of the dummy gate and on the sacrificial layer, removing the dummy gate and the first semiconductor layer, forming a gate electrode in regions from which the dummy gate and the first semiconductor layer are removed, forming a liner layer on a sidewall of the gate electrode by removing a part of the liner material layer formed on the sacrificial layer, removing the sacrificial layer to expose the source/drain region, forming a barrier material layer along a profile of each of the source/drain region and a sidewall of the liner layer after the removing of the sacrificial layer, forming a silicide layer by heat-treating a part of the barrier material layer in contact with the source/drain region, and forming a filling layer on the silicide layer.

A semiconductor device, according to some embodiments, may include a substrate and a gate electrode on the substrate. The semiconductor device may include a source/drain region adjacent the gate electrode. Moreover, the semiconductor device may include a source/drain contact on the source/drain region. A portion of the source/drain contact may extend below a lower surface of the gate electrode and between first and second sidewalls of the source/drain region.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Hereinafter, a semiconductor device according to some embodiments of the present disclosure will be described with reference to FIGS. 1 to 5.

Figure 1:
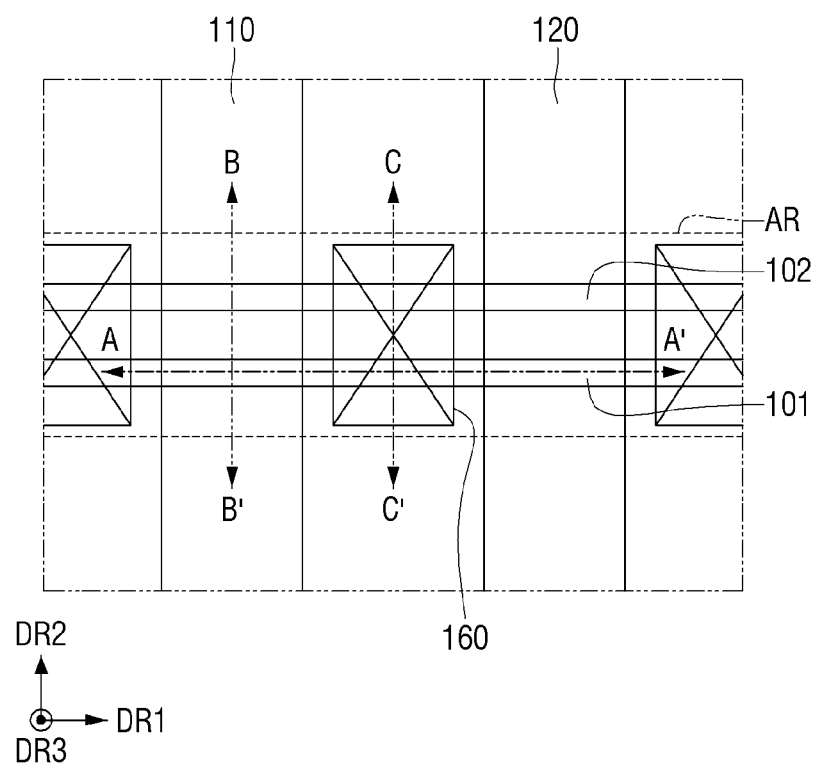
FIG. 1 is a layout diagram illustrating a semiconductor device according to some embodiments of the present disclosure.
Figure 2:
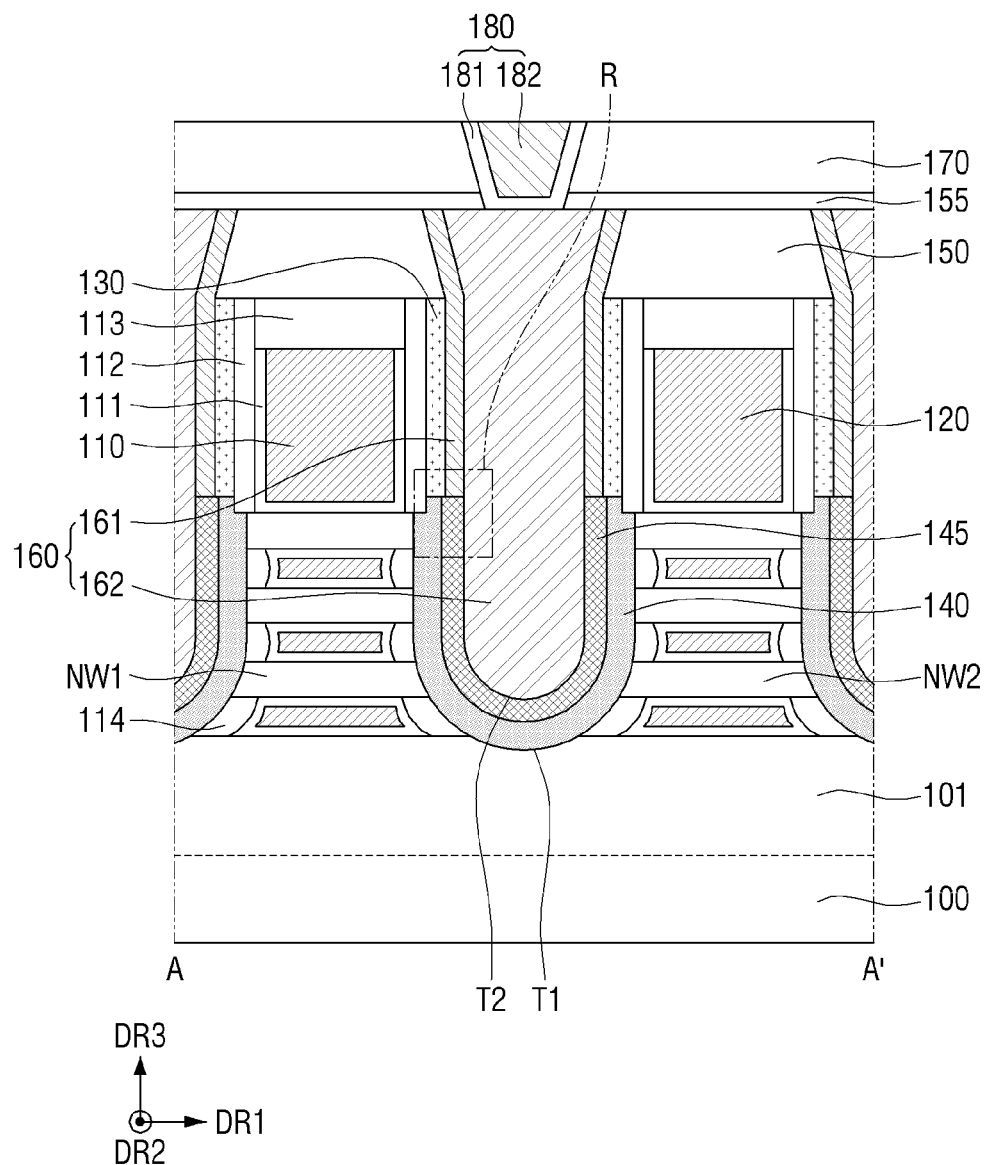
FIG. 2 is a cross-sectional view taken along line A-A' of FIG. 1.
Figure 3:
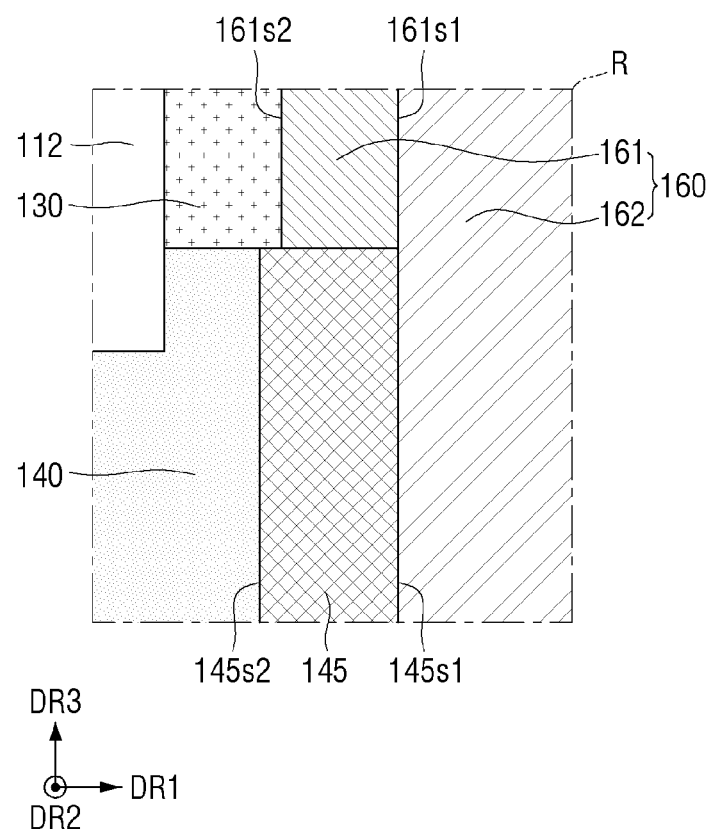
FIG. 3 is an enlarged view of area R of FIG. 2.
Figure 4:
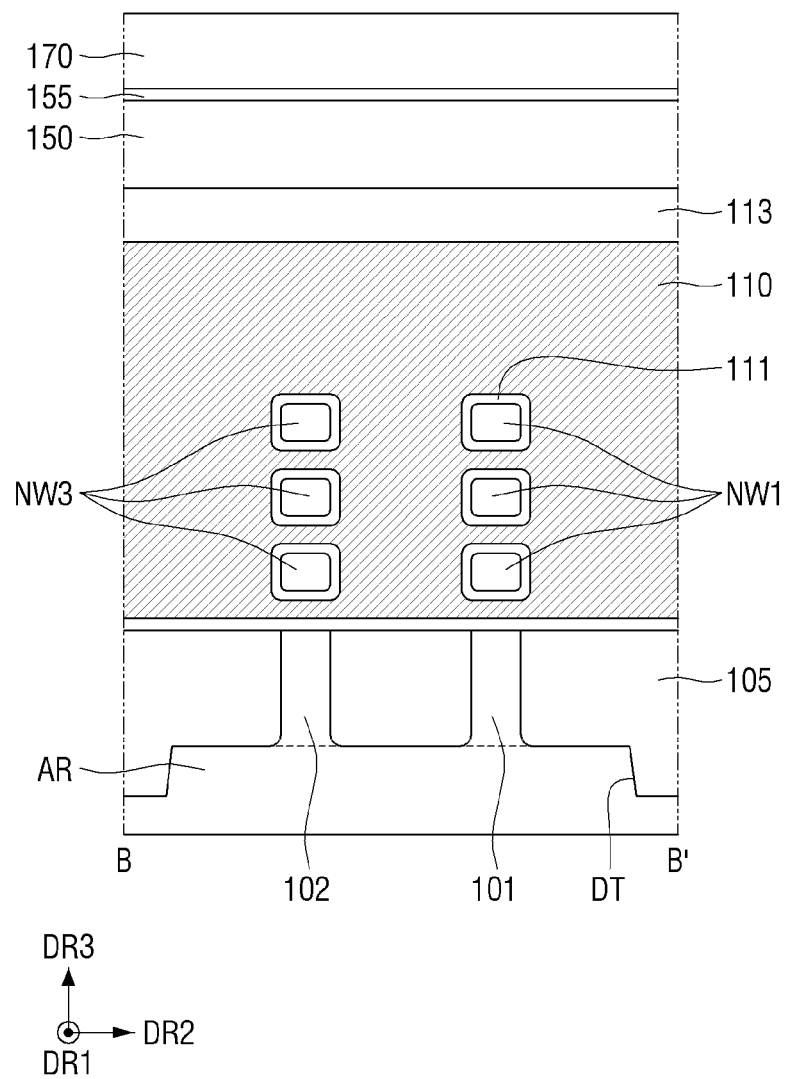
FIG. 4 is a cross-sectional view taken along line B-B' of FIG. 1.
Figure 5:
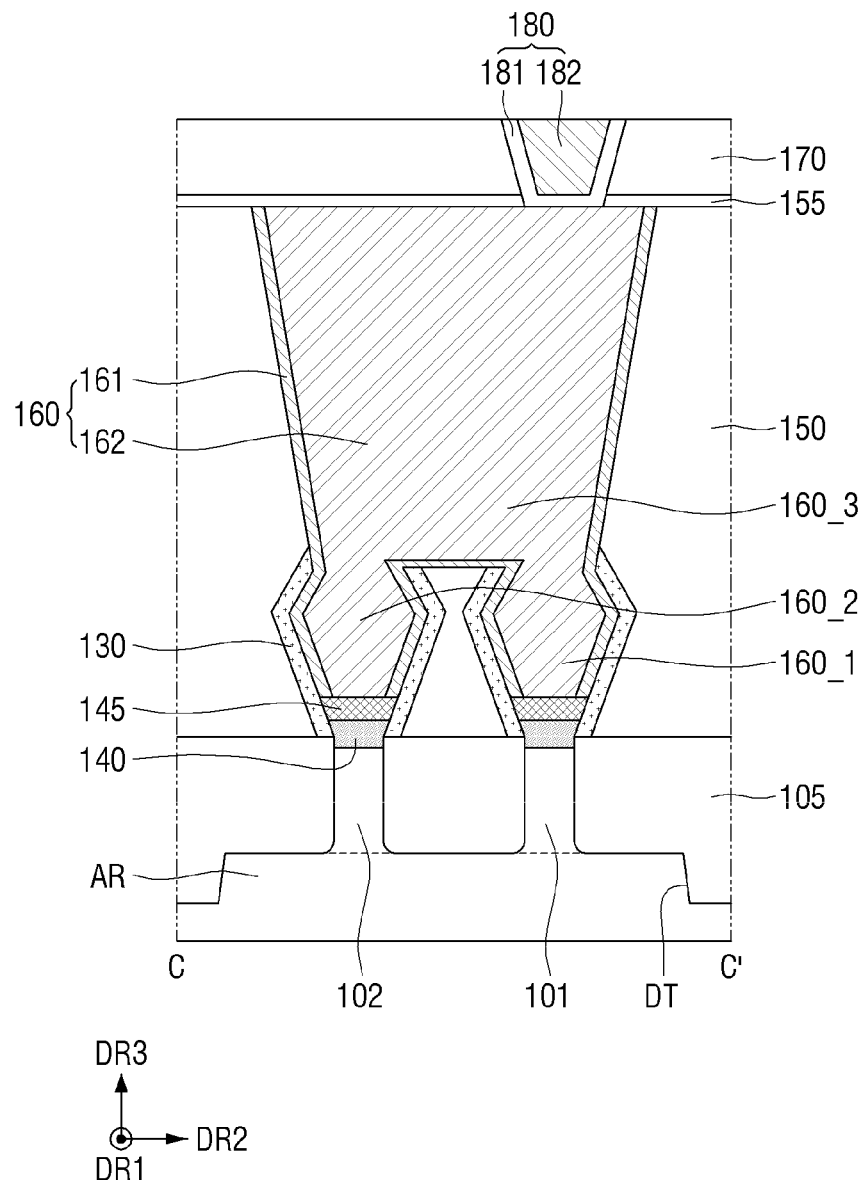
FIG. 5 is a cross-sectional view taken along line C-C' of FIG. 1.

FIG. 1 is a layout diagram illustrating a semiconductor device according to some embodiments of the present disclosure. FIG. 2 is a cross-sectional view taken along line A-A' of FIG. 1. FIG. 3 is an enlarged view of area R of FIG. 2. FIG. 4 is a cross-sectional view taken along line B-B' of FIG. 1. FIG. 5 is a cross-sectional view taken along line C-C' of FIG. 1.

Referring to FIGS. 1 to 5, a semiconductor device according to some embodiments of the present disclosure includes a substrate 100, a first active pattern 101, a second active pattern 102, a field insulating layer 105, a first gate electrode 110, a gate insulating layer 111, an external spacer 112, a capping pattern 113, an internal spacer 114, a second gate electrode 120, a liner layer 130, a source/drain region 140, a silicide layer 145, a first interlayer insulating layer 150, an etch stop layer 155, a source/drain contact 160, a second interlayer insulating layer 170, and a via 180.

The substrate 100 may be a silicon substrate or silicon-on-insulator (SOI) substrate. Alternatively, the substrate 100 may include silicon germanium, silicon germanium on insulator (SGOI), indium antimonide, a lead tellurium compound, indium arsenide, indium phosphide, gallium arsenide, or gallium antimonide, but the present disclosure is not limited thereto.

An active region AR may protrude from the substrate 100 in a vertical direction DR3. As shown in FIG. 4, the active region AR may be defined by a deep trench DT.

The first active pattern 101 may extend in a first horizontal direction DR1 on the active region AR. The first active pattern 101 may protrude from the active region AR. The second active pattern 102 may extend in the first horizontal direction DR1 on the active region AR. The second active pattern 102 may be spaced apart from the first active pattern 101 in a second horizontal direction DR2 different from the first horizontal direction DR1. The second active pattern 102 may protrude from the active region AR.

In some embodiments, each of the first and second active patterns 101 and 102 may be, for example, a fin-shaped pattern. Each of the first and second active patterns 101 and 102 may be used as a channel pattern of a transistor. In FIG. 1, two active patterns 101 and 102 are illustrated to be disposed in the active region AR, but this is for simplicity of description, and the present disclosure is not limited thereto.

Each of the first active pattern 101 and the second active pattern 102 may be a part of the substrate 100 and may include an epitaxial layer grown from the substrate 100. Each of the first active pattern 101 and the second active pattern 102 may include, for example, silicon or germanium, which is an elemental semiconductor material. In addition, each of the first active pattern 101 and the second active pattern 102 may include a compound semiconductor, for example, a group IV-IV compound semiconductor or a group III-V compound semiconductor.

The group IV-IV compound semiconductor may be a binary compound or a ternary compound including at least two elements carbon (C), silicon (Si), germanium (Ge) and tin (Sn), or the above-mentioned compound doped with a group IV element. The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimony (Sb) which are group V elements.

A field insulating layer 105 may be formed on the substrate 100. The field insulating layer 105 may fill the deep trench DT. The sidewall of the active region AR may be surrounded by the field insulating layer 105. The field insulating layer 105 may be disposed on a part of the sidewall of the first active pattern 101 and a part of the sidewall of the second active pattern 102. The field insulating layer 105 may include, for example, an oxide layer, a nitride layer, an oxynitride layer, or a combination layer thereof.

A plurality of nanosheets may be arranged on each of the first active pattern 101 and the second active pattern 102. The plurality of nanosheets may include a plurality of nanosheets that are stacked to be spaced apart from each other in the vertical direction DR3.

For example, a first plurality of nanosheets NW1 may include three nanosheets stacked to be spaced apart from each other in the vertical direction DR3 above the first active pattern 101. A second plurality of nanosheets NW2 may include three nanosheets stacked to be spaced apart from each other in the vertical direction DR3 above the first active pattern 101. The second plurality of nanosheets NW2 may be spaced apart from the first plurality of nanosheets NW1 in the first horizontal direction DR1. A third plurality of nanosheets NW3 may include three nanosheets stacked to be spaced apart from each other in the vertical direction DR3 above the second active pattern 102. The third plurality of nanosheets NW3 may be spaced apart from the first plurality of nanosheets NW1 in the second horizontal direction DR2.

In FIGS. 2 and 4, it is illustrated that each of the first to third plurality of nanosheets NW1, NW2, and NW3 includes three nanosheets, but this is for simplicity of description, and the present disclosure is not limited thereto. In some other embodiments, each of the first to third plurality of nanosheets NW1, NW2, and NW3 may include four or more nanosheets stacked to be spaced apart from each other in the vertical direction DR3.

The first gate electrode 110 may extend in the second horizontal direction DR2 above the substrate 100. The first gate electrode 110 may cross each of the first and second active patterns 101 and 102 above the first and second active patterns 101 and 102. The first gate electrode 110 may surround each of the first plurality of nanosheets NW1 and each of the third plurality of nanosheets NW3.

The second gate electrode 120 may extend in the second horizontal direction DR2 above the substrate 100. The second gate electrode 120 may cross each of the first and second active patterns 101 and 102 above the first and second active patterns 101 and 102. The second gate electrode 120 may be spaced apart from the first gate electrode 110 in the first horizontal direction DR1. The second gate electrode 120 may surround the second plurality of nanosheets NW2.

Each of the first gate electrode 110 and the second gate electrode 120 may include, for example, at least one titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminide (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof. Each of the first gate electrode 110 and the second gate electrode 120 may include conductive metal oxide, conductive metal oxynitride or the like, and may include an oxidized form of the aforementioned material.

The gate insulating layer 111 may be disposed between the first plurality of nanosheets NW1 and the first gate electrode 110. The gate insulating layer 111 may be disposed between the second plurality of nanosheets NW2 and the second gate electrode 120. The gate insulating layer 111 may be disposed between the third plurality of nanosheets NW3 and the first gate electrode 110.

The gate insulating layer 111 may be disposed between the first gate electrode 110 and each of the first and second active patterns 101 and 102. The gate insulating layer 111 may be disposed between the second gate electrode 120 and each of the first and second active patterns 101 and 102. The gate insulating layer 111 may be disposed between the field insulating layer 105 and the first gate electrode 110 and between the field insulating layer 105 and the second gate electrode 120. The gate insulating layer 111 may be disposed between the external spacer 112 and the first gate electrode 110 and between the external spacer 112 and the second gate electrode 120.

The gate insulating layer 111 may include at least one of silicon oxide, silicon oxynitride, silicon nitride, or a high dielectric constant material having a higher dielectric constant than silicon oxide. The high dielectric constant material may include, for example, at least one hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

A semiconductor device according to some other embodiments may include a negative capacitance field effect transistor (NCFET) using a negative capacitor. For example, the gate insulating layer 111 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. On the other hand, when at least one of the capacitances of two or more capacitors connected in series has a negative value, the total capacitance may have a positive value and may be greater than the absolute value of each capacitance.

When a ferroelectric material layer having a negative capacitance and a paraelectric material layer having a positive capacitance are connected in series, the total capacitance value of the ferroelectric material layer and the paraelectric material layer connected in series may increase. By using an increase in the total capacitance value, the transistor including the ferroelectric material layer may have a subthreshold swing (SS) less than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, or lead zirconium titanium oxide. In this case, as one example, the hafnium zirconium oxide may be a material containing hafnium oxide doped with zirconium (Zr). As another example, the hafnium zirconium oxide may be a compound of hafnium (Hf), zirconium (Zr), and oxygen (O).

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic percent (at %) of aluminum. In this case, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

The ferroelectric material layer may have a thickness that exhibits ferroelectric properties. The thickness of the ferroelectric material layer may be, for example, in a range of 0.5 to 10 nanometers (nm), but is not limited thereto. Since a critical thickness at which each ferroelectric material exhibits ferroelectric properties may be different, the thickness of the ferroelectric material layer may vary depending on the ferroelectric material.

In one example, the gate insulating layer 111 may include one ferroelectric material layer. In another example, the gate insulating layer 111 may include a plurality of ferroelectric material layers spaced apart from each other. The gate insulating layer 111 may have a laminated layer structure in which a plurality of ferroelectric material layers and a plurality of paraelectric material layers are alternately laminated.

The external spacer 112 may be disposed along the sidewall of the first gate electrode 110, on the uppermost nanosheet of the first plurality of nanosheets NW1. The external spacer 112 may be disposed along the sidewall of the first gate electrode 110, on each of the active region AR and the field insulating layer 105. In addition, the external spacer 112 may be disposed along the sidewall of the second gate electrode 120, on the uppermost nanosheet of the second plurality of nanosheets NW2. The external spacer 112 may be disposed along the sidewall of the second gate electrode 120, on each of the active region AR and the field insulating layer 105.

The external spacer 112 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC) or a combination thereof.

The capping pattern 113 may be disposed on each of the first and second gate electrodes 110 and 120. In FIG. 2, the capping pattern 113 is shown to be disposed on the top surface of the gate insulating layer 111 between the inner walls of the external spacers 112, but the present disclosure is not limited thereto. In some other embodiments, the capping pattern 113 may be disposed on the top surface of the external spacer 112, the top surface of the gate insulating layer 111, the top surface of the first gate electrode 110, and the top surface of the second gate electrode 120.

The capping pattern 113 may include, for example, a material having an etch selectivity with respect to the first interlayer insulating layer 150. The capping pattern 113 may include, for example, at least one of silicon nitride (SiN), silicon oxynitride (SiON), silicon oxide (SiO$_2$), silicon carbonitride (SiCN), silicon oxycarbonitride (SiOCN), and a combination thereof.

The source/drain region 140 may be disposed to at least one side of the first gate electrode 110 above the active region AR. The source/drain region 140 may be in contact with the first plurality of nanosheets NW1. In addition, the source/drain region 140 may be disposed to at least one side of the second gate electrode 120 above the active region AR. The source/drain region 140 may be in contact with the second plurality of nanosheets NW2.

For example, the source/drain region 140 may be disposed inside a first trench T1 formed between the first gate electrode 110 and the second gate electrode 120. As shown in FIG. 2, the source/drain region 140 may be disposed in a liner shape along the side and bottom surfaces of the first trench T1 in the cross-sectional view taken along the first horizontal direction DR1. However, the present disclosure is not limited thereto.

In FIG. 2, the top surface of the source/drain region 140 is shown to be formed higher than the top surface of the uppermost nanosheet of the first plurality of nanosheets NW1 and the top surface of the uppermost nanosheet of the second plurality of nanosheets NW2, but the present disclosure is not limited thereto.

The internal spacer 114 may be disposed on opposite sides of the first gate electrode 110 between the first plurality of nanosheets NW1. The internal spacer 114 may be disposed on opposite sides of the first gate electrode 110 between the lowermost nanosheet of the first plurality of nanosheets NW1 and the first active pattern 101. In addition, the internal spacer 114 may be disposed on opposite sides of the second gate electrode 120 between the second plurality of nanosheets NW2. The internal spacer 114 may be disposed on opposite sides of the second gate electrode 120 between the lowermost nanosheet of the second plurality of nanosheets NW2 and the first active pattern 101. The internal spacer 114 may be disposed between the gate insulating layer 111 and the source/drain region 140.

The internal spacer 114 may be in contact with the source/drain region 140. The internal spacer 114 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC) or a combination thereof. However, the present disclosure is not limited thereto.

The first interlayer insulating layer 150 may be disposed on (e.g., to cover) the external spacer 112, the capping pattern 113, the field insulating layer 105, and the source/drain region 140. The first interlayer insulating layer 150 may include, for example, at least one of silicon oxide, silicon nitride, silicon oxynitride, or a low-k (low dielectric constant) material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but the present disclosure is not limited thereto.

The source/drain contact 160 may be disposed on/above the source/drain region 140. The source/drain contact 160 may penetrate the first interlayer insulating layer 150 in the vertical direction DR3 to extend to the inside of the source/drain region 140. As shown in FIG. 2, a lower portion of the source/drain contact 160 may extend (i) below (i.e., closer to the substrate 100 than) a lower surface of the first gate electrode 110 (e.g., a lower surface of a portion of the first gate electrode 110 that is above the first plurality of nanosheets NW1 and (ii) between opposite first and second sidewalls of the source/drain region 140. For example, the lower portion of the source/drain contact 160 may extend below a lower surface of the uppermost nanosheet of the first plurality of nanosheets NW1 (and, in some embodiments, below an upper surface of the lowermost nanosheet of the first plurality of nanosheets NW1). Accordingly, the source/drain region 140 can wrap around the lower portion of the source/drain contact 160. As a result, an area of overlap between the source/drain region 140 and the source/drain contact 160 can increase. In some embodiments, each of the opposite first and second sidewalls of the source/drain region 140 may be thinner in the first horizontal direction DR1 than a width of the source/drain contact 160 in the first horizontal direction DR1. Moreover, an upper portion of a sidewall of the source/drain contact 160 may be on (e.g., covered by) the first interlayer insulating layer 150.

The first interlayer insulating layer 150 may not be disposed between the first gate electrode 110 and the source/drain contact 160 and between the second gate electrode 120 and the source/drain contact 160. However, the present disclosure is not limited thereto. In some other embodiments, the first interlayer insulating layer 150 may be disposed between the first gate electrode 110 and the source/drain contact 160 and between the second gate electrode 120 and the source/drain contact 160.

The source/drain contact 160 may include first to third portions 160_1, 160_2, and 160_3. For example, the first portion 160_1 of the source/drain contact 160 may be disposed above the first active pattern 101. The second portion 160_2 of the source/drain contact 160 may be disposed above the second active pattern 102. The first portion 160_1 of the source/drain contact 160 may be spaced apart from the second portion 160_2 of the source/drain contact 160 in the second horizontal direction DR2. The first interlayer insulating layer 150 may be disposed between the first portion 160_1 of the source/drain contact 160 and the second portion 160_2 of the source/drain contact 160.

As shown in FIG. 5, in the cross-sectional view taken along the second horizontal direction DR2, the bottom and top surfaces of the first portion 160_1 of the source/drain contact 160 may be formed to have widths smaller than the width of the central portion. Such a shape of the first portion 160_1 of the source/drain contact 160 is caused by etching the source/drain region 140 to form the first portion 160_1 of the source/drain contact 160. The shape of the second portion 160_2 of the source/drain contact 160 may be similar to the shape of the first portion 160_1 of the source/drain contact 160.

The third portion 160_3 of the source/drain contact 160 may be disposed on the first portion 160_1 of the source/drain contact 160 and the second portion 160_2 of the source/drain contact 160. The third portion 160_3 of the source/drain contact 160 may be in contact with each of the first portion 160_1 of the source/drain contact 160 and the second portion 160_2 of the source/drain contact 160. The third portion 160_3 of the source/drain contact 160 may connect (e.g., electrically connect) the first portion 160_1 of the source/drain contact 160 to the second portion 160_2 of the source/drain contact 160.

The source/drain contact 160 may include a first barrier layer 161 and a first filling layer 162.

The first filling layer 162 may be disposed inside a second trench T2 defined by the first barrier layer 161 and the silicide layer 145. As shown in FIG. 2, the silicide layer 145 may extend between the first filling layer 162 and a first sidewall of the source/drain region 140 and between the first filling layer 162 and an opposite, second sidewall of the source/drain region 140, such that the silicide layer 145 wraps around a lower portion of the first filling layer 162. For example, the first filling layer 162 may completely fill the second trench T2. The first filling layer 162 may include, for example, at least one of aluminum (Al), copper (Cu), tungsten (W), cobalt (Co), ruthenium (Ru), or molybdenum (Mo). However, the present disclosure is not limited thereto.

The first barrier layer 161 may be disposed along the sidewall of the first filling layer 162. The first barrier layer 161 may not be disposed between the first filling layer 162 and the source/drain region 140. The first barrier layer 161 may include a first sidewall 161s1 and a second sidewall 161s2 opposite to the first sidewall 161s1. The first sidewall 161s1 of the first barrier layer 161 may be in contact with the first filling layer 162. The second sidewall 161s2 of the first barrier layer 161 may be in contact with the liner layer 130 and the first interlayer insulating layer 150.

The first barrier layer 161 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), or rhodium (Rh). However, the present disclosure is not limited thereto.

The liner layer 130 may be disposed between the source/drain contact 160 and the first gate electrode 110, between the source/drain contact 160 and the second gate electrode 120, and between the source/drain contact 160 and the first interlayer insulating layer 150. In addition, as shown in FIG. 5, the liner layer 130 may be disposed between the source/drain region 140 and the first interlayer insulating layer 150 and between the silicide layer 145 and the first interlayer insulating layer 150. For example, the liner layer 130 may be conformally formed. The liner layer 130 may be in contact with the external spacer 112.

The liner layer 130 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC) or a combination thereof.

The silicide layer 145 may be disposed between the source/drain region 140 and the first filling layer 162. The silicide layer 145 may be disposed along the profile of a boundary surface between the source/drain region 140 and the source/drain contact 160. As shown in FIG. 5, in the cross-sectional view taken along the second horizontal direction DR2, the silicide layer 145 is not disposed on the sidewall of the source/drain contact 160.

The silicide layer 145 may include a first sidewall 145s1 and a second sidewall 145s2 opposite to the first sidewall 145s1. The first sidewall 145s1 of the silicide layer 145 may be in contact with the first filling layer 162. The second sidewall 145s2 of the silicide layer 145 may be in contact with the source/drain region 140. The uppermost surface of the silicide layer 145 may be in contact with the first barrier layer 161 (e.g., with a lowermost surface thereof). The liner layer 130 may be in contact, for example, with each of the uppermost surface of the source/drain region 140 and the uppermost surface of the silicide layer 145.

The first sidewall 145s1 of the silicide layer 145 may have a slope profile continuous with the first sidewall 161s1 of the first barrier layer 161. For example, the first sidewall 145s1 of the silicide layer 145 may extend from (e.g., be aligned with) the first sidewall 161s1 of the first barrier layer 161 in the vertical direction DR3 such that the first sidewall 145s1 and the first sidewall 161s1 collectively form a continuous line/profile. The silicide layer 145 may include, for example, a metal silicide material.

The etch stop layer 155 may be disposed on the first interlayer insulating layer 150. The etch stop layer 155 may be on (e.g., may cover) a part of the top surface of the source/drain contact 160. FIG. 2 illustrates that the etch stop layer 155 is formed as a single layer, but the present disclosure is not limited thereto. In some other embodiments, the etch stop layer 155 may be formed as a multilayer structure. The etch stop layer 155 may include, for example, at least one of silicon oxide, silicon nitride, silicon oxynitride, or a low dielectric constant material.

The second interlayer insulating layer 170 may be disposed on the etch stop layer 155. The second interlayer insulating layer 170 may include, for example, at least one of silicon oxide, silicon nitride, silicon oxynitride, or a low dielectric constant material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HIVIDS), trimethylsilyl borate (TMSB), diacetoxyditertiarybutosiloxane (DADBS), trimethylsilyl phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but the present disclosure is not limited thereto.

The via 180 may penetrate the second interlayer insulating layer 170 and the etch stop layer 155 in the vertical direction DR3 to be connected (e.g., electrically connected) to the source/drain contact 160. The via 180 may include a second barrier layer 181 and a second filling layer 182. The second barrier layer 181 may form the sidewall and the bottom surface of the via 180. The second filling layer 182 may be disposed on the second barrier layer 181.

The second barrier layer 181 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), or rhodium (Rh). However, the present disclosure is not limited thereto.

The second filling layer 182 may include, for example, at least one of aluminum (Al), copper (Cu), tungsten (W), cobalt (Co), ruthenium (Ru), or molybdenum (Mo). However, the present disclosure is not limited thereto.

Hereinafter, a semiconductor device according to some embodiments of the present disclosure will be described with reference to FIGS. 2 and 6 to 19.

FIGS. 6 to 19 are diagrams for describing a method for fabricating a semiconductor device according to some embodiments of the present disclosure.

Figure 6:
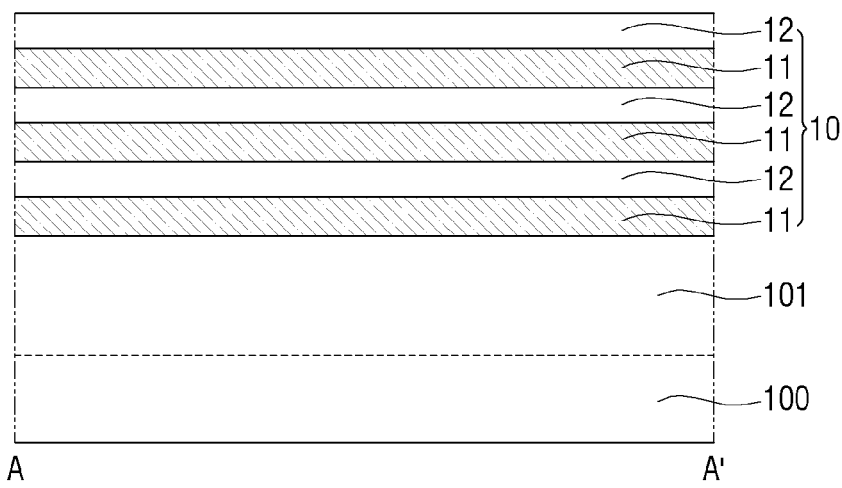
FIGS. 6 to 19 are diagrams for describing a method for fabricating a semiconductor device according to some embodiments of the present disclosure.
Figure 6:
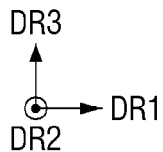

Referring to FIG. 6, a stacked structure 10 in which a first semiconductor layer 11 and a second semiconductor layer 12 are alternately stacked may be formed above the substrate 100. For example, the first semiconductor layer 11 may be formed at the lowermost portion of the stacked structure 10, and the second semiconductor layer 12 may be formed at the uppermost portion of the stacked structure 10. However, the present disclosure is not limited thereto. The first semiconductor layer 11 may include, for example, silicon germanium (SiGe). The second semiconductor layer 12 may include, for example, silicon (Si).

Subsequently, the deep trench DT (see FIG. 4) may be formed on the substrate 100 to define the active region AR (see FIG. 4). Thereafter, the first active pattern 101 and the second active pattern 102 may be formed on the active region AR (see FIG. 4).

Figure 7:
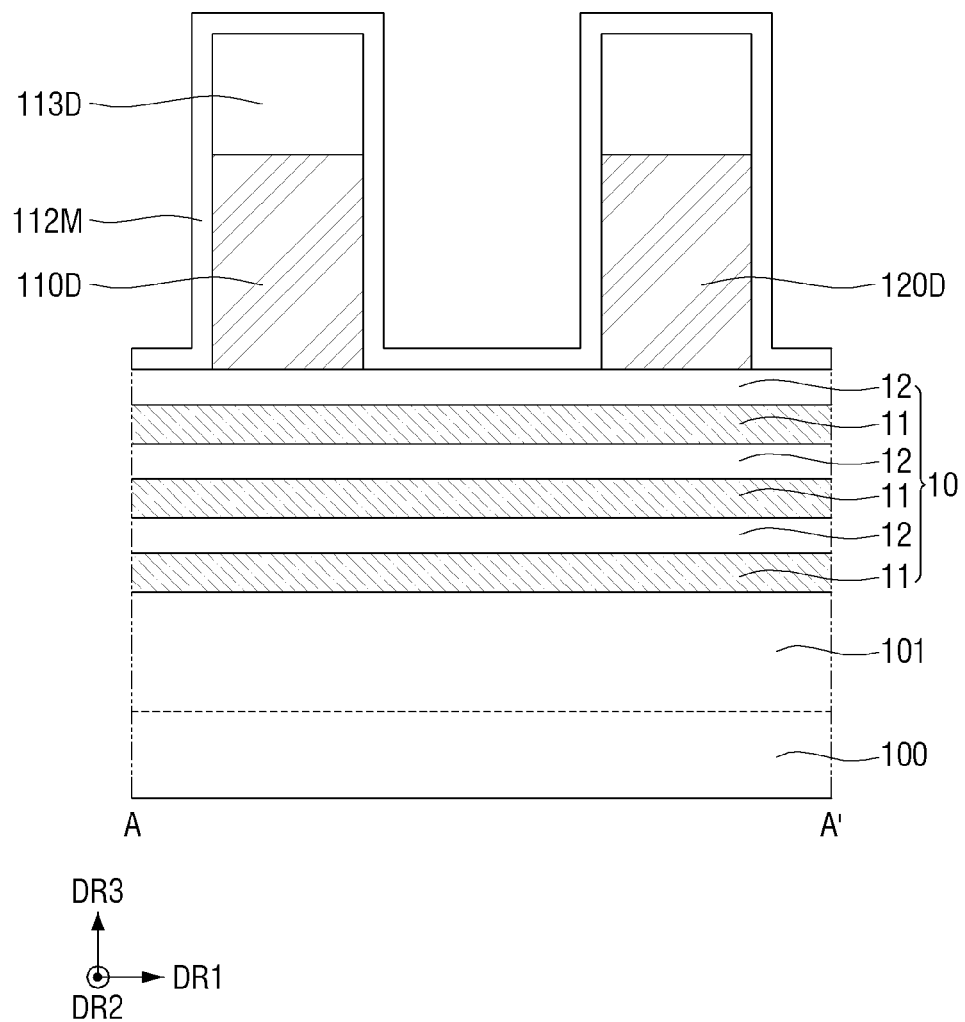

Referring to FIG. 7, a first dummy gate 110D and a second dummy gate 120D may be formed on the stacked structure 10. Each of the first dummy gate 110D and the second dummy gate 120D may extend in the second horizontal direction DR2. The second dummy gate 120D may be spaced apart from the first dummy gate 110D in the first horizontal direction DR1. In addition, a dummy capping pattern 113D may be formed on each of the first dummy gate 110D and the second dummy gate 120D. The dummy capping pattern 113D may completely overlap each of the first dummy gate 110D and the second dummy gate 120D in the vertical direction DR3.

Subsequently, an external spacer material layer 112M may be formed on (e.g., to cover) the stacked structure 10, the first dummy gate 110D, the second dummy gate 120D, and the dummy capping pattern 113D. The external spacer material layer 112M may be formed, for example, conformally.

Figure 8:
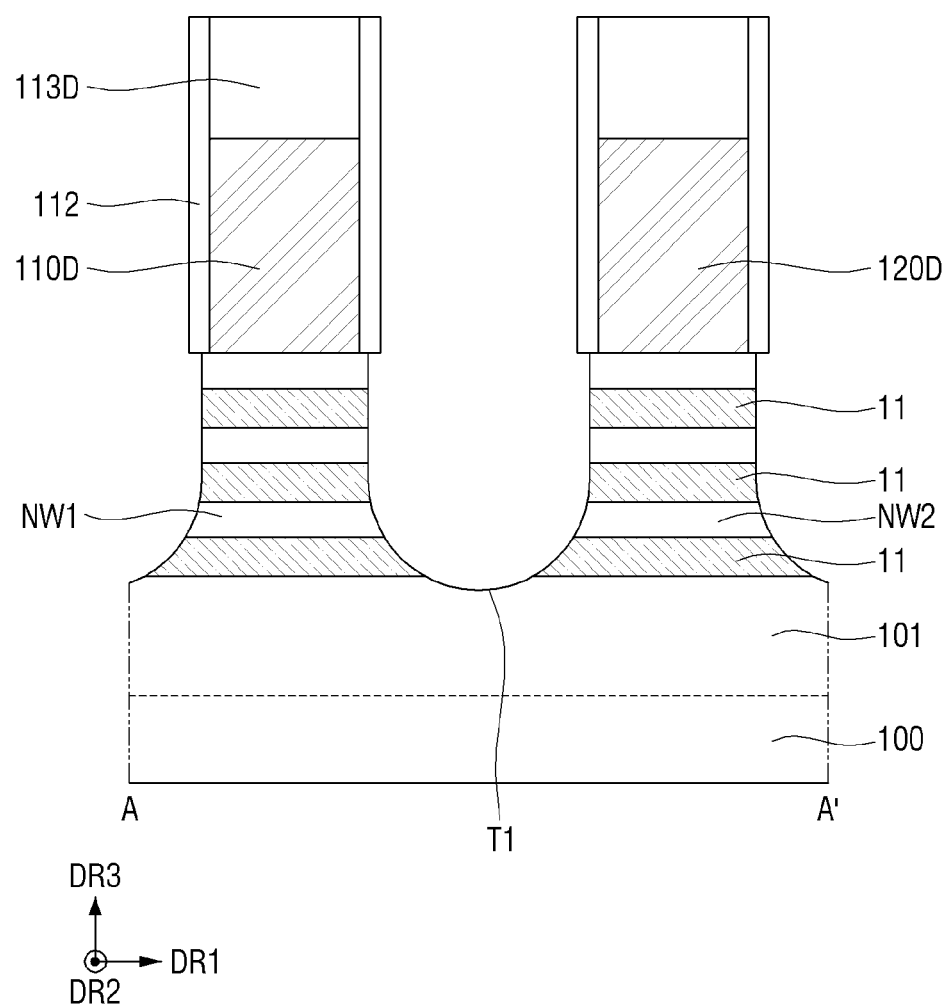

Referring to FIG. 8, the stacked structure 10 may be etched using the first dummy gate 110D, the second dummy gate 120D, the dummy capping pattern 113D, and the external spacer material layer 112M as a mask to form the first trench T1.

The second semiconductor layer 12 separated by the first trench T1 may form a plurality of nanosheets. For example, the second semiconductor layer 12 remaining under the first dummy gate 110D forms the first plurality of nanosheets NW1, and the second semiconductor layer 12 remaining under the second dummy gate 120D may form the second plurality of nanosheets NW2.

While the first trench T1 is formed, a part of the external spacer material layer 112M formed on the top surface of the dummy capping pattern 113D and the stacked structure 10 may be etched. Accordingly, the external spacer 112 may be formed on the sidewalls of each of the first dummy gate 110D, the second dummy gate 120D, and the dummy capping pattern 113D. For example, the first trench T1 may extend to the inside of the first active pattern 101. In addition, the first trench T1 may extend below the external spacer 112.

Figure 9:
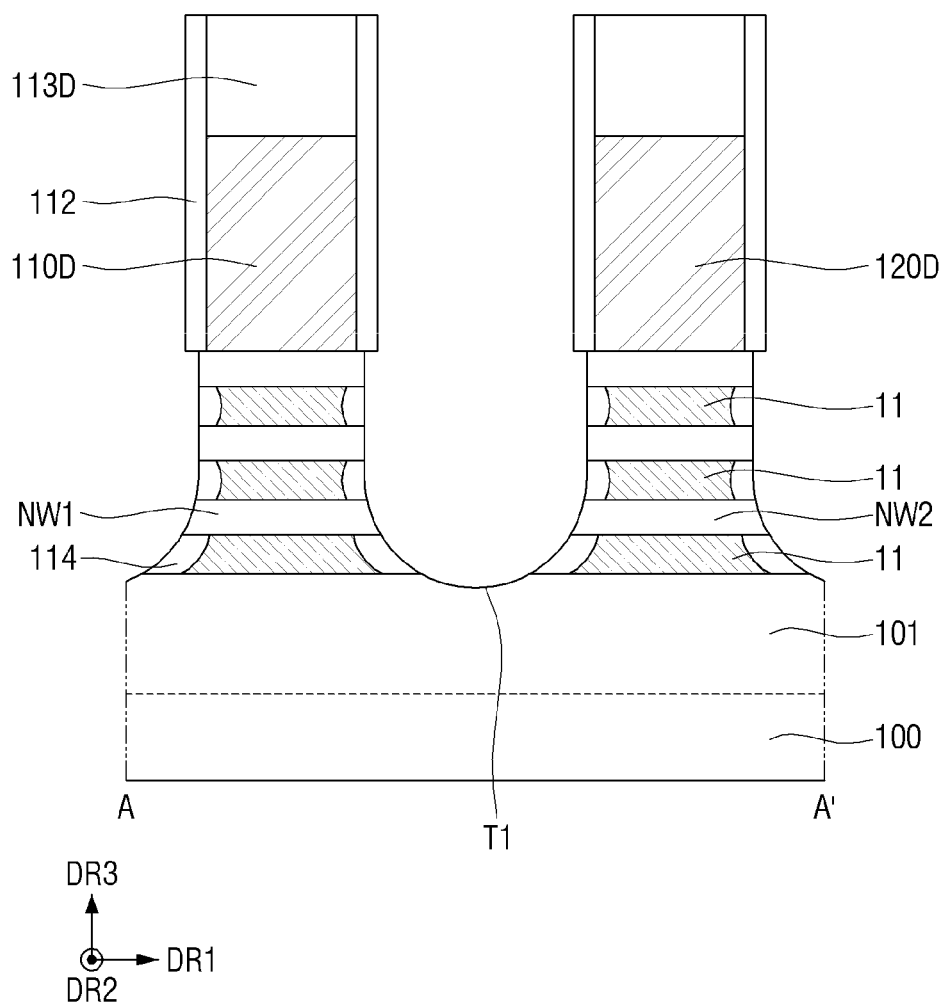

Referring to FIG. 9, a part of the sidewall of the first semiconductor layer 11 exposed through the first trench T1 may be etched. Accordingly, the sidewall of the first semiconductor layer 11 may be formed to be more recessed than each of the sidewalls of the first plurality of nanosheets NW1 and the sidewalls of the second plurality of nanosheets NW2. Subsequently, the internal spacer 114 may be formed in a portion where the first semiconductor layer 11 is etched.

Figure 10:
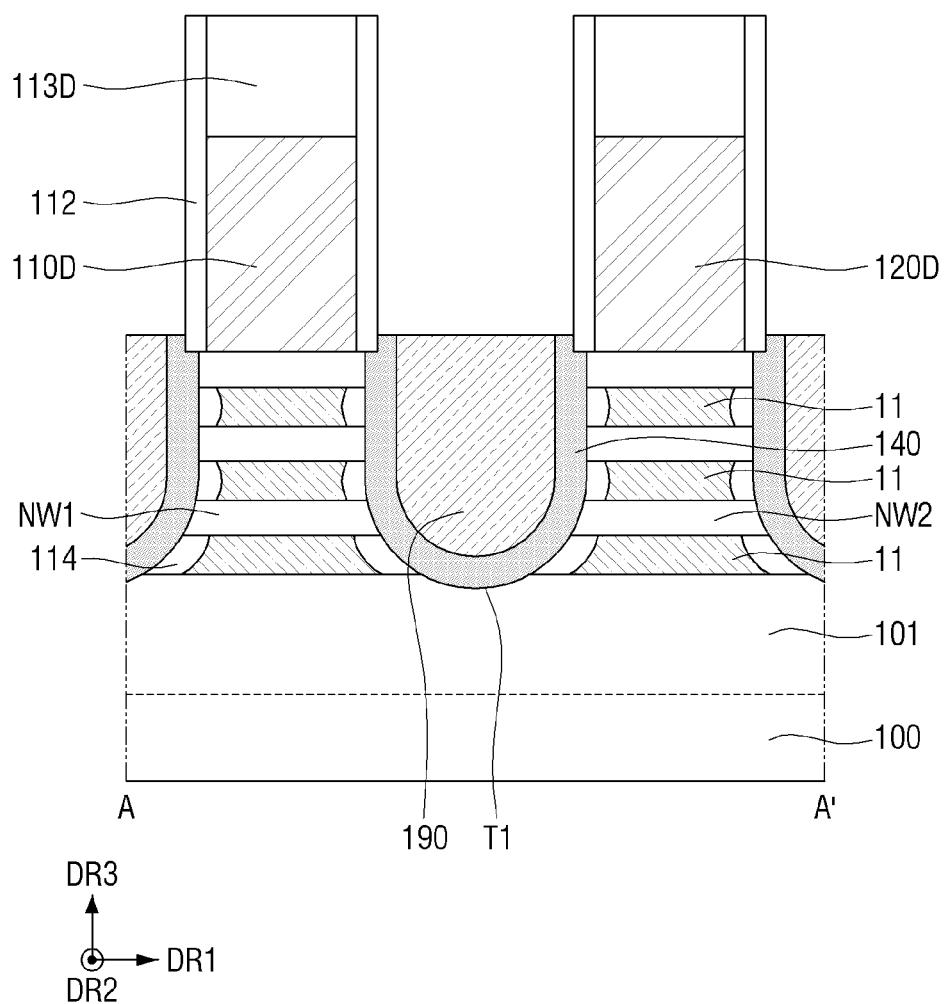

Referring to FIG. 10, the source/drain region 140 may be formed inside the first trench T1. The source/drain region 140 may be formed along the sidewall and the bottom surface of the first trench T1. For example, the source/drain region 140 may be epitaxially grown from each of the first plurality of nanosheets NW1, the second plurality of nanosheets NW2, and the first active pattern 101 which are exposed to the first trench T1.

Subsequently, a sacrificial layer 190 may be formed on the source/drain region 140 in (e.g., to fill) the first trench T1. For example, the sacrificial layer 190 may completely fill the inside of the first trench T1, but the present disclosure is not limited thereto. In FIG. 10, the top surface of the sacrificial layer 190 is shown to be formed on the same plane as the top surface of the source/drain region 140, but this is for simplicity of description, and the present disclosure is not limited thereto.

The source/drain region 140 and the sacrificial layer 190 may include materials of different compositions having an etch selectivity. For example, the source/drain region 140 may include either silicon (Si) or silicon germanium (SiGe) containing germanium (Ge) having a first concentration. The sacrificial layer 190 may include silicon germanium (SiGe) containing germanium (Ge) having a second concentration higher than the first concentration.

In some other embodiments, the source/drain region 140 may include silicon germanium (SiGe) containing germanium (Ge) having a third concentration. The sacrificial layer 190 may include either silicon (Si) or silicon germanium (SiGe) containing germanium (Ge) having a fourth concentration lower than the third concentration.

In still other embodiments, an NMOS region and a PMOS region may be defined in the substrate 100. The source/drain region 140 disposed in the NMOS region may include either silicon (Si) or silicon germanium (SiGe) containing germanium (Ge) having a first concentration. The sacrificial layer 190 disposed in the NMOS region may include silicon germanium (SiGe) containing germanium (Ge) having a second concentration higher than the first concentration. In addition, the source/drain region 140 disposed in the PMOS region may include silicon germanium (SiGe) containing germanium (Ge) having a third concentration higher than the first concentration. The sacrificial layer 190 disposed in the PMOS region may include either silicon (Si) or silicon germanium (SiGe) containing germanium (Ge) having a fourth concentration lower than the third concentration.

Since the source/drain region 140 and the sacrificial layer 190 are formed to include materials of different compositions having an etch selectivity, the sacrificial layer 190 may be selectively removed in a subsequent process.

Figure 11:
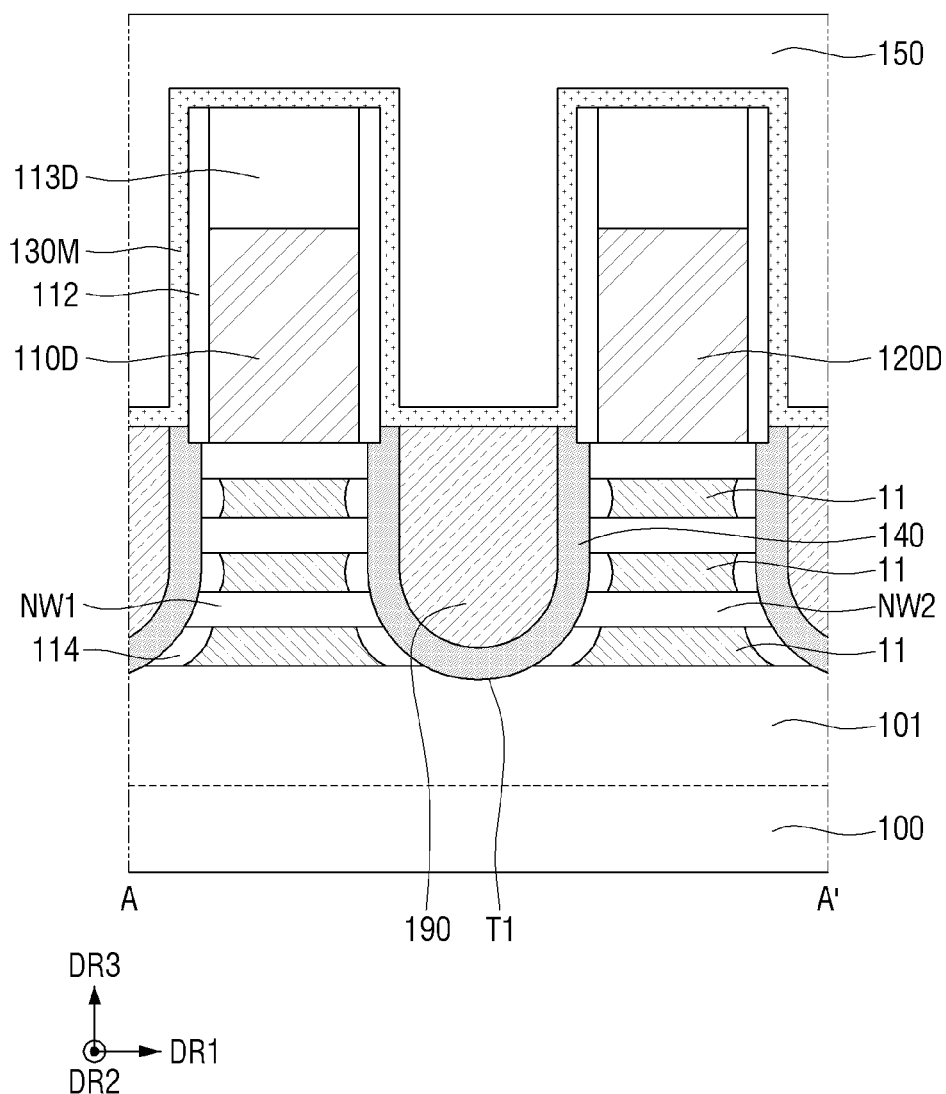

Referring to FIG. 11, a liner material layer 130M may be formed on the top surface of the dummy capping pattern 113D, on the sidewall of the external spacer 112, on the sacrificial layer 190, and on the source/drain region 140. For example, the liner material layer 130M may be conformally formed, but the present disclosure is not limited thereto. Subsequently, the first interlayer insulating layer 150 may be formed on the liner material layer 130M.

Figure 12:
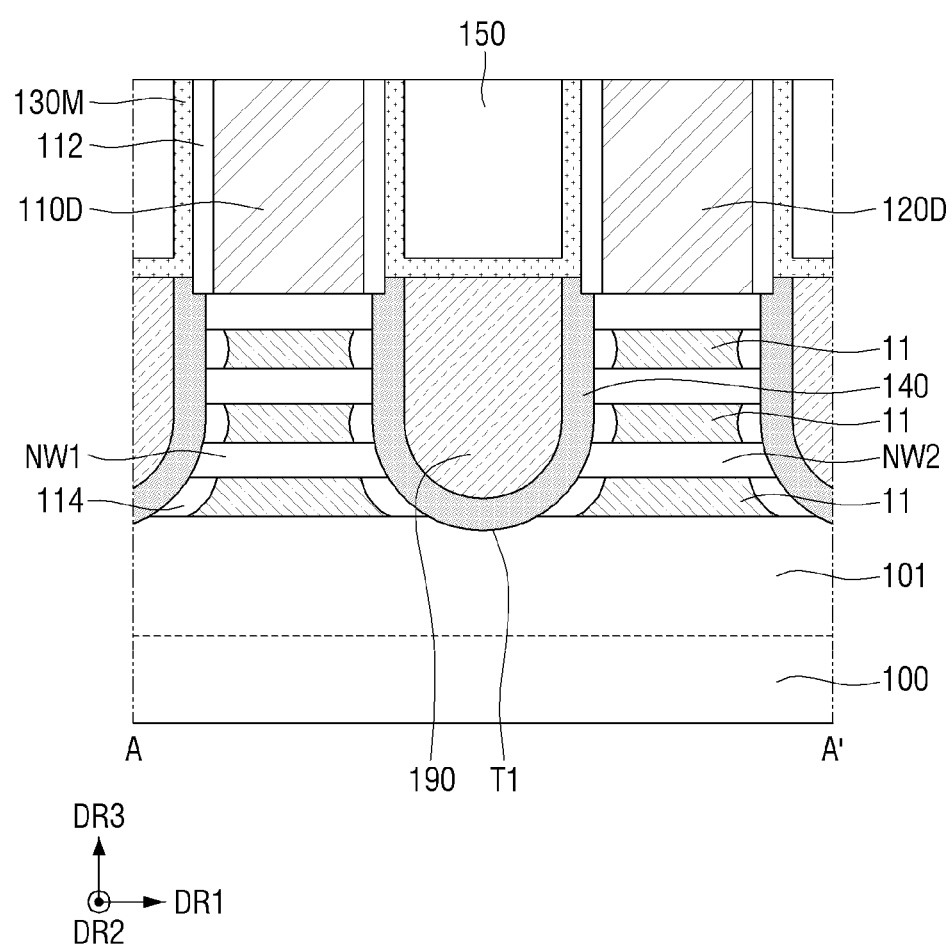

Referring to FIG. 12, a part of the first interlayer insulating layer 150, a part of the liner material layer 130M, a part of the external spacer 112, and the dummy capping pattern 113D may be removed through a planarization process (e.g., CMP process). Accordingly, each of the first dummy gate 110D and the second dummy gate 120D may be exposed.

Figure 13:
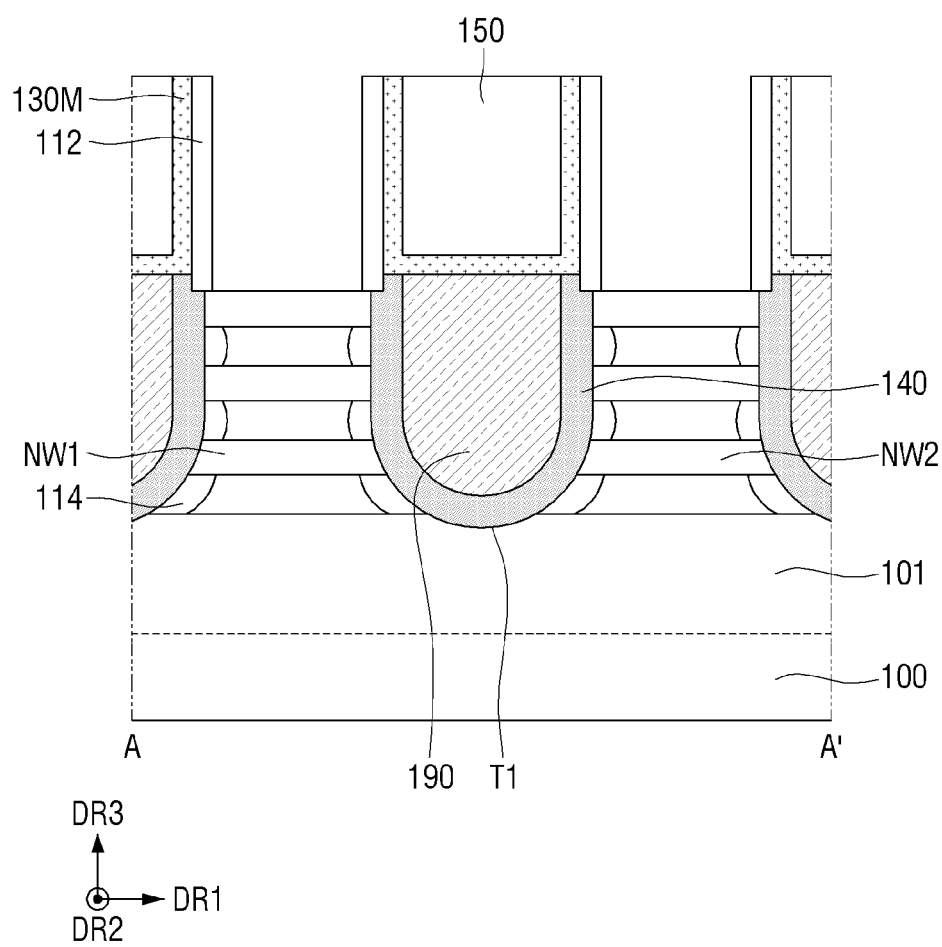

Referring to FIG. 13, the first dummy gate 110D, the second dummy gate 120D, and the first semiconductor layer 11 may be removed.

Figure 14:
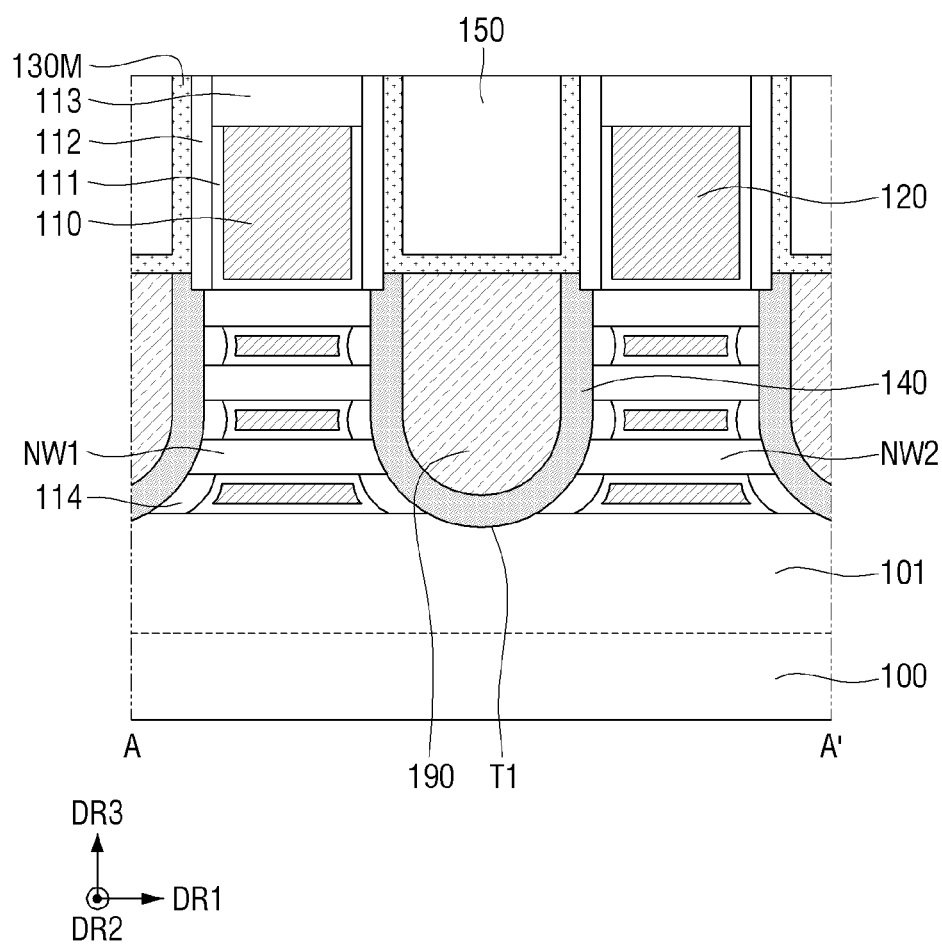

Referring to FIG. 14, the gate insulating layer 111, the first gate electrode 110, and the capping pattern 113 may be formed in portions/regions where the first dummy gate 110D and the first semiconductor layer 11 are removed. In addition, the gate insulating layer 111, the second gate electrode 120, and the capping pattern 113 may be formed in portions/regions where the second dummy gate 120D and the first semiconductor layer 11 are removed.

Figure 15:
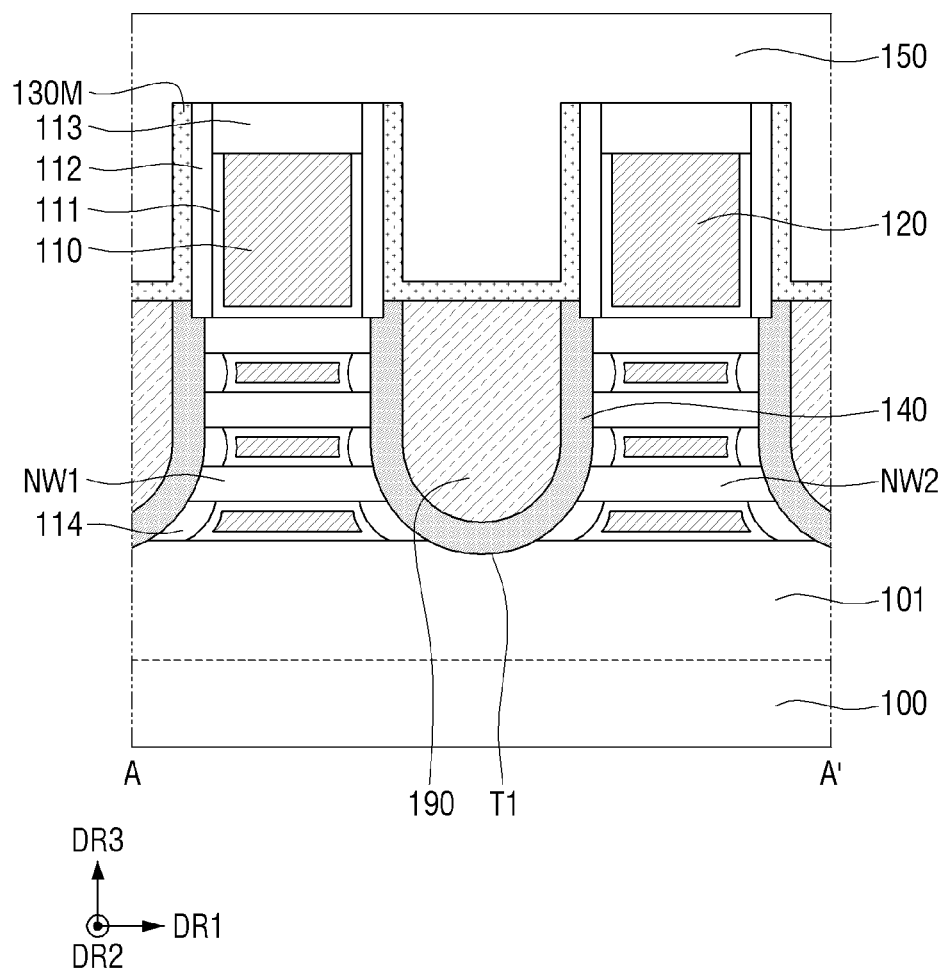

Referring to FIG. 15, the first interlayer insulating layer 150 may be additionally formed on (e.g., to cover) the capping pattern 113. However, the present disclosure is not limited thereto. In some other embodiments, a process of additionally forming the first interlayer insulating layer 150 on the capping pattern 113 may be omitted.

Figure 16:
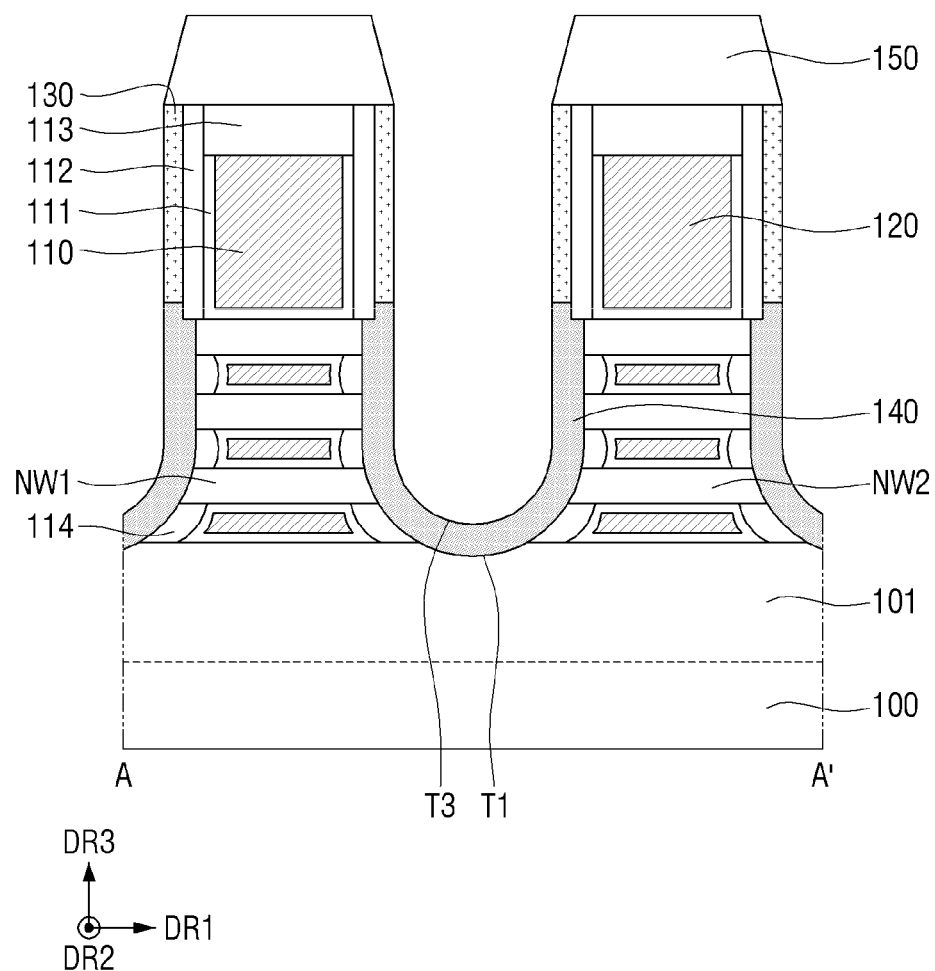

Referring to FIG. 16, a third trench T3 for forming the source/drain contact 160 (see FIG. 2) may be formed. The third trench T3 may penetrate the first interlayer insulating layer 150 in the vertical direction DR3 and extend to the source/drain region 140. The source/drain region 140 may be exposed through the third trench T3.

While the third trench T3 is formed, the sacrificial layer 190 and a part of the liner material layer 130M formed on the top surface of the sacrificial layer 190 may be removed. Accordingly, the liner layer 130 formed on the sidewall of the external spacer 112 may be formed. For example, the sidewall of the liner layer 130 formed on the sidewall of the external spacer 112 may extend from (e.g., have a slope profile continuous with) the sidewall of the source/drain region 140 such that the sidewall of the liner layer 130 and the sidewall of the source/drain region 140 collectively form a continuous line/profile.

Figure 17:
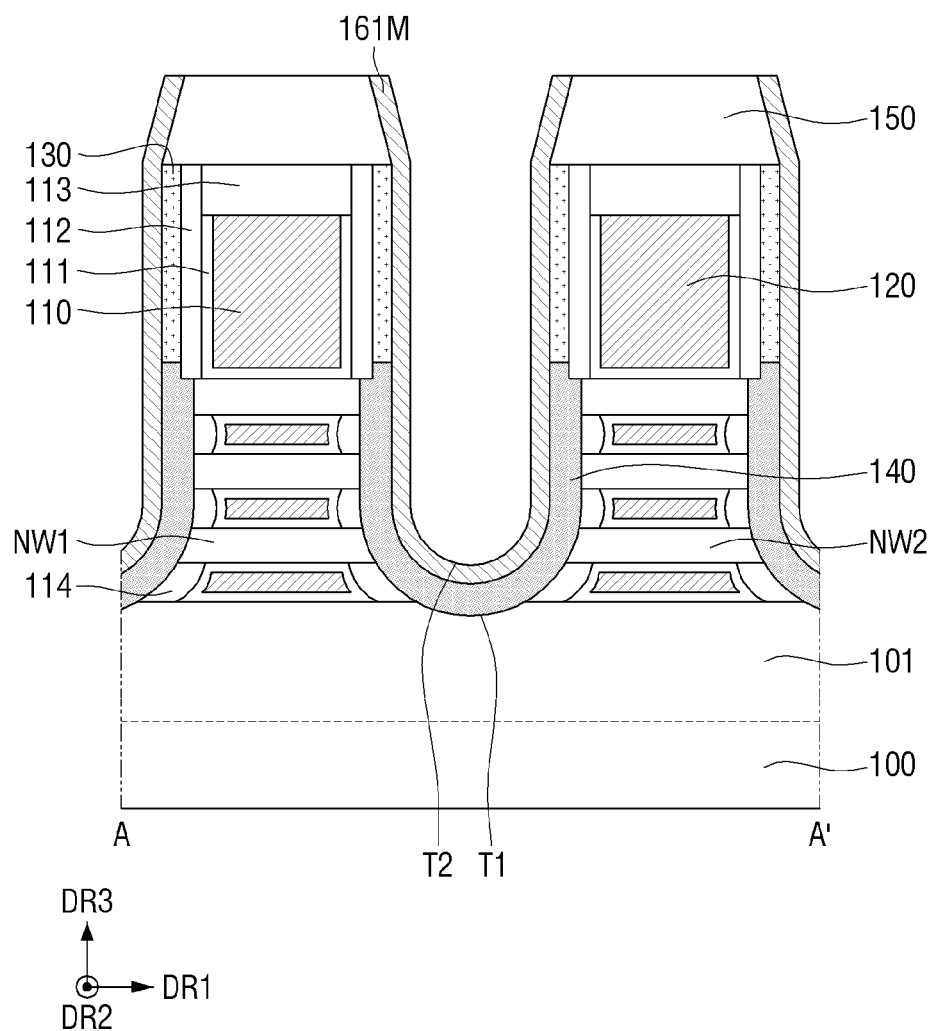

Referring to FIG. 17, a barrier material layer 161M may be formed along the sidewall and the bottom surface of the third trench T3. The barrier material layer 161M may be formed along the profile of each of the source/drain region 140 and the sidewall of the liner layer 130. For example, the barrier material layer 161M may be conformally formed.

Figure 18:
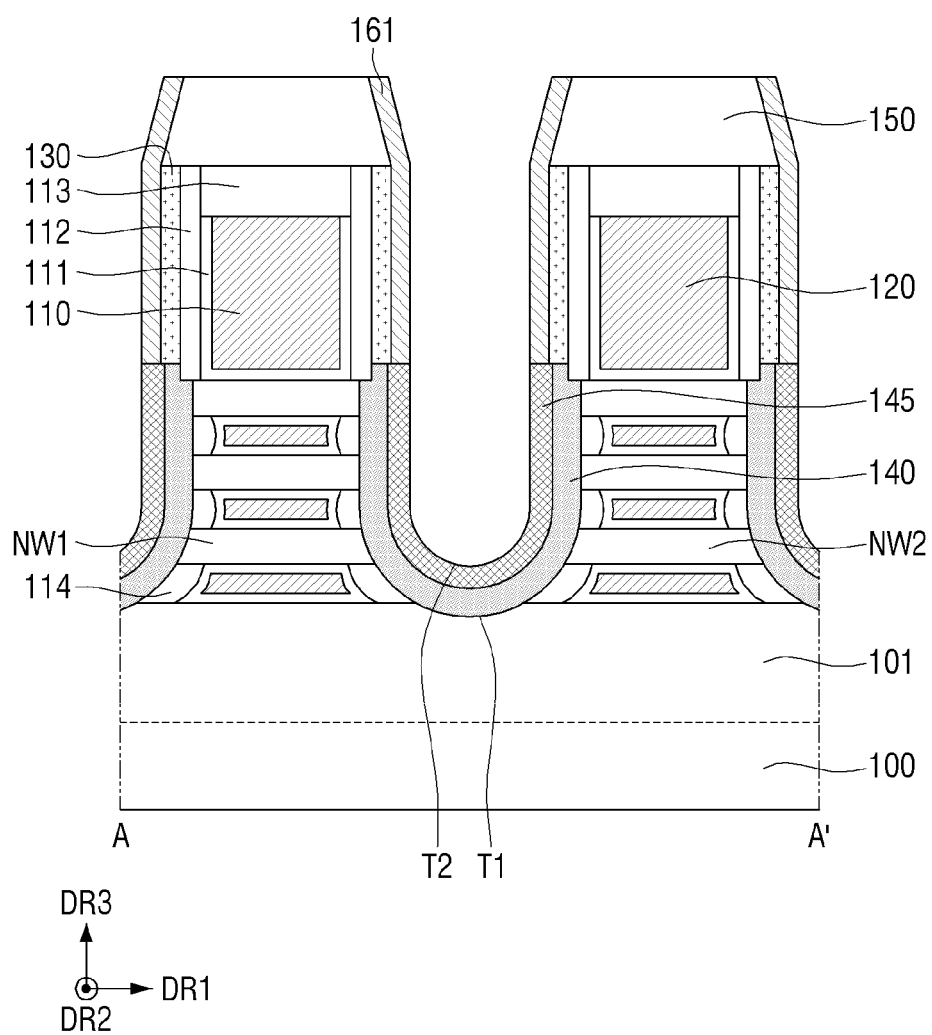

Referring to FIG. 18, the silicide layer 145 may be formed by heat-treating a part of the barrier material layer 161M in contact with the source/drain region 140. For example, while heat treatment is performed on the barrier material layer 161M, a part of the source/drain region 140 in contact with the barrier material layer 161M may also be converted to the silicide layer 145.

The portion of the barrier material layer 161M remaining after the silicide layer 145 is formed may be defined as the first barrier layer 161. In addition, the second trench T2 may be defined by the silicide layer 145 and the first barrier layer 161. The sidewall of the first barrier layer 161 exposed to the second trench T2 may extend from (e.g., have a slope profile continuous with) the sidewall of the silicide layer 145 exposed to the second trench T2 such that the sidewall of the first barrier layer 161 and the sidewall of the silicide layer 145 collectively form a continuous line/profile.

Figure 19:
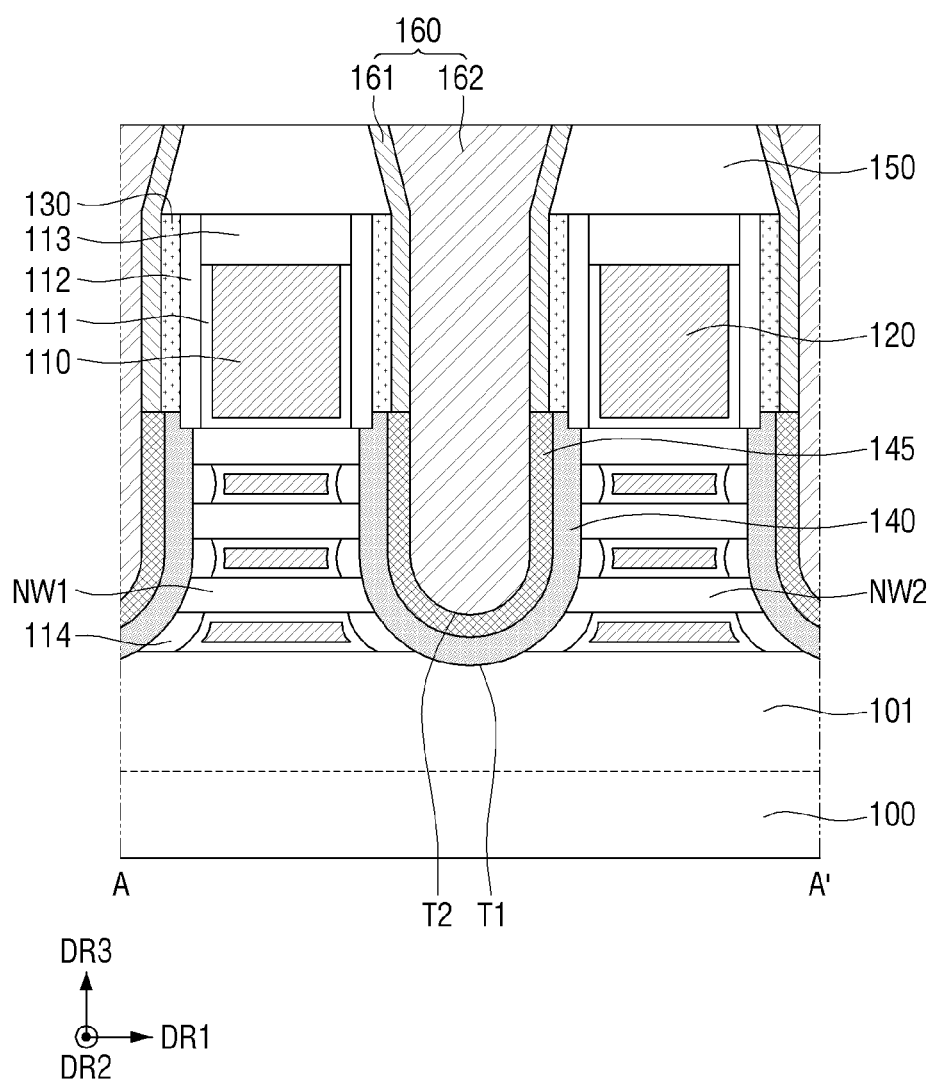

Referring to FIG. 19, the first filling layer 162 may be formed on the silicide layer 145 and the first barrier layer 161 in (e.g., to fill) the second trench T2.

Referring again to FIG. 2, the etch stop layer 155 and the second interlayer insulating layer 170 may be sequentially formed on the first interlayer insulating layer 150 and the source/drain contact 160. Subsequently, the via 180 may be formed to penetrate the second interlayer insulating layer 170 and the etch stop layer 155 in the vertical direction DR3. The via 180 may be in contact with the source/drain contact 160. Through this fabricating method, the semiconductor device shown in FIG. 2 may be fabricated.

In the semiconductor device and the method for fabricating the semiconductor device according to some embodiments of the present disclosure, the area of the boundary surface between the source/drain region 140 and the source/drain contact 160 may be increased, thereby reducing/minimizing the interfacial resistance. In addition, in the semiconductor device and the method for fabricating the semiconductor device according to some embodiments of the present disclosure, the source/drain contact 160 is formed after removing the sacrificial layer 190 formed on the source/drain region 140, thereby inhibiting/preventing the source/drain region 140 from protruding in a lateral direction. Accordingly, the reliability of the semiconductor device may be improved by lowering the driving power of the semiconductor device.

Hereinafter, a semiconductor device according to some other embodiments of the present disclosure will be described with reference to FIGS. 20 and 21. Differences from the semiconductor device shown in FIGS. 1 to 5 will be mainly described.

Figure 20:
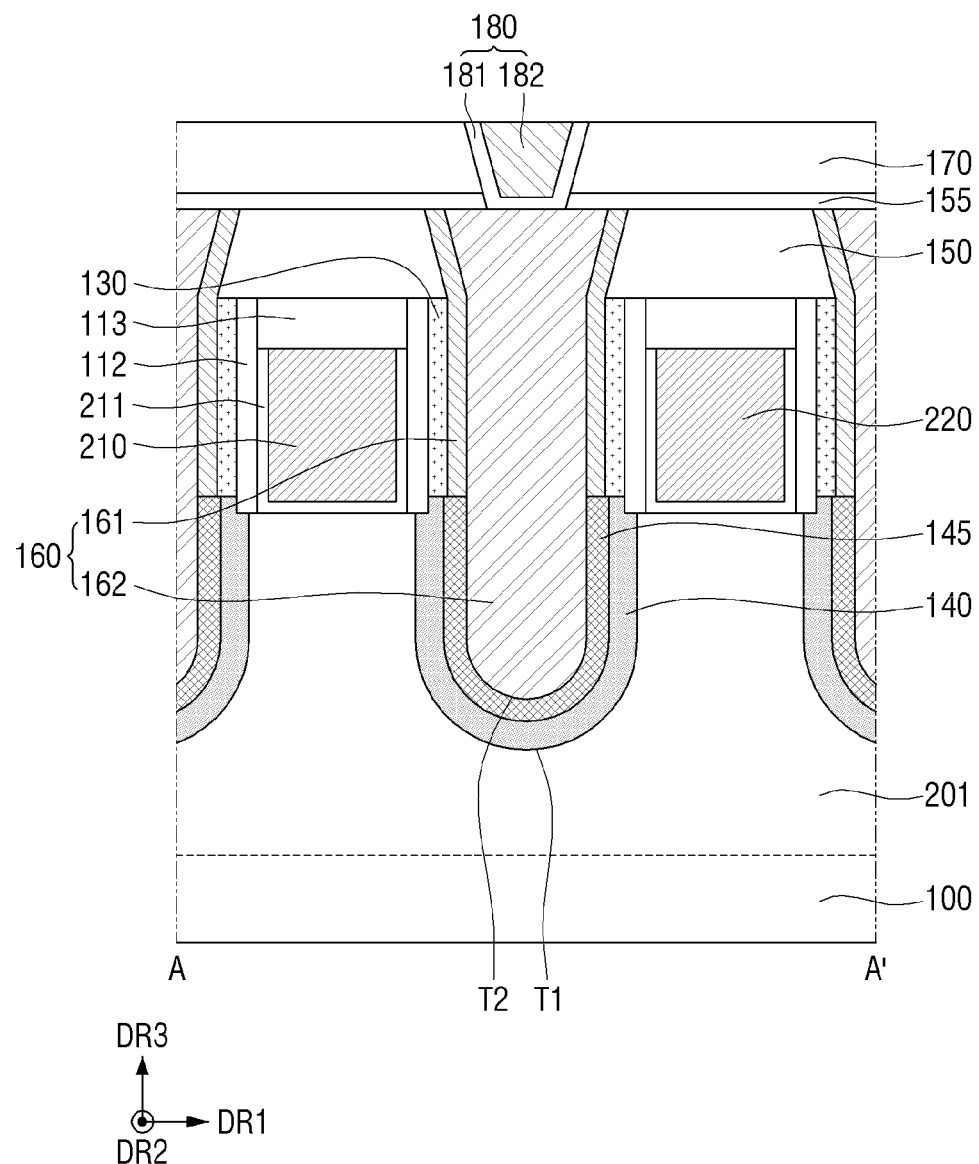
FIGS. 20 and 21 are cross-sectional views showing a semiconductor device according to some other embodiments of the present disclosure.
Figure 21:
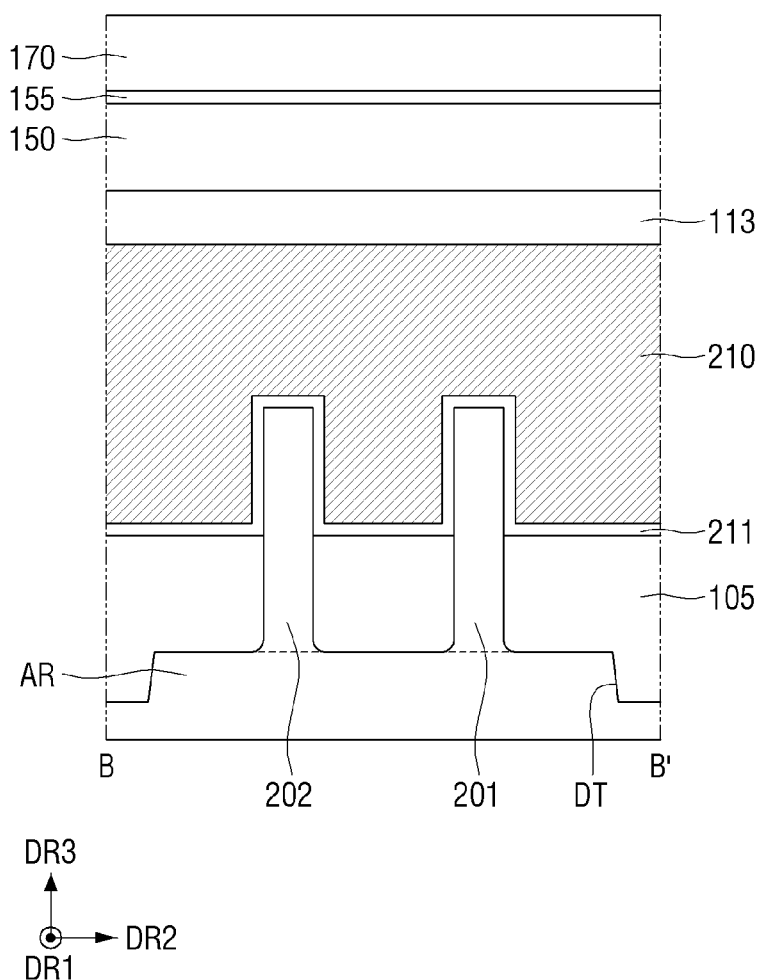

FIGS. 20 and 21 are cross-sectional views showing a semiconductor device according to some other embodiments of the present disclosure.

Referring to FIGS. 20 and 21, a semiconductor device according to some other embodiments of the present disclosure may have a fin-type transistor (FinFET) structure.

For example, each of a first active pattern 201 and a second active pattern 202 may protrude from the active region AR in the vertical direction DR3. As shown in FIG. 21, each of the first active pattern 201 and the second active pattern 202 may extend to the inside of a first gate electrode 210.

The first gate electrode 210 may extend in the second horizontal direction DR2 on the first active pattern 201 and the second active pattern 202. A second gate electrode 220 may extend in the second horizontal direction DR2 on the first active pattern 201 and the second active pattern 202. The second gate electrode 220 may be spaced apart from the first gate electrode 210 in the first horizontal direction DR1.

A gate insulating layer 211 may be disposed along the sidewall and the bottom surface of the first gate electrode 210. In addition, the gate insulating layer 211 may be disposed along the sidewall and the bottom surface of the second gate electrode 220.

Hereinafter, a semiconductor device according to still other embodiments of the present disclosure will be described with reference to FIG. 22. Differences from the semiconductor device shown in FIGS. 1 to 5 will be mainly described.

Figure 22:
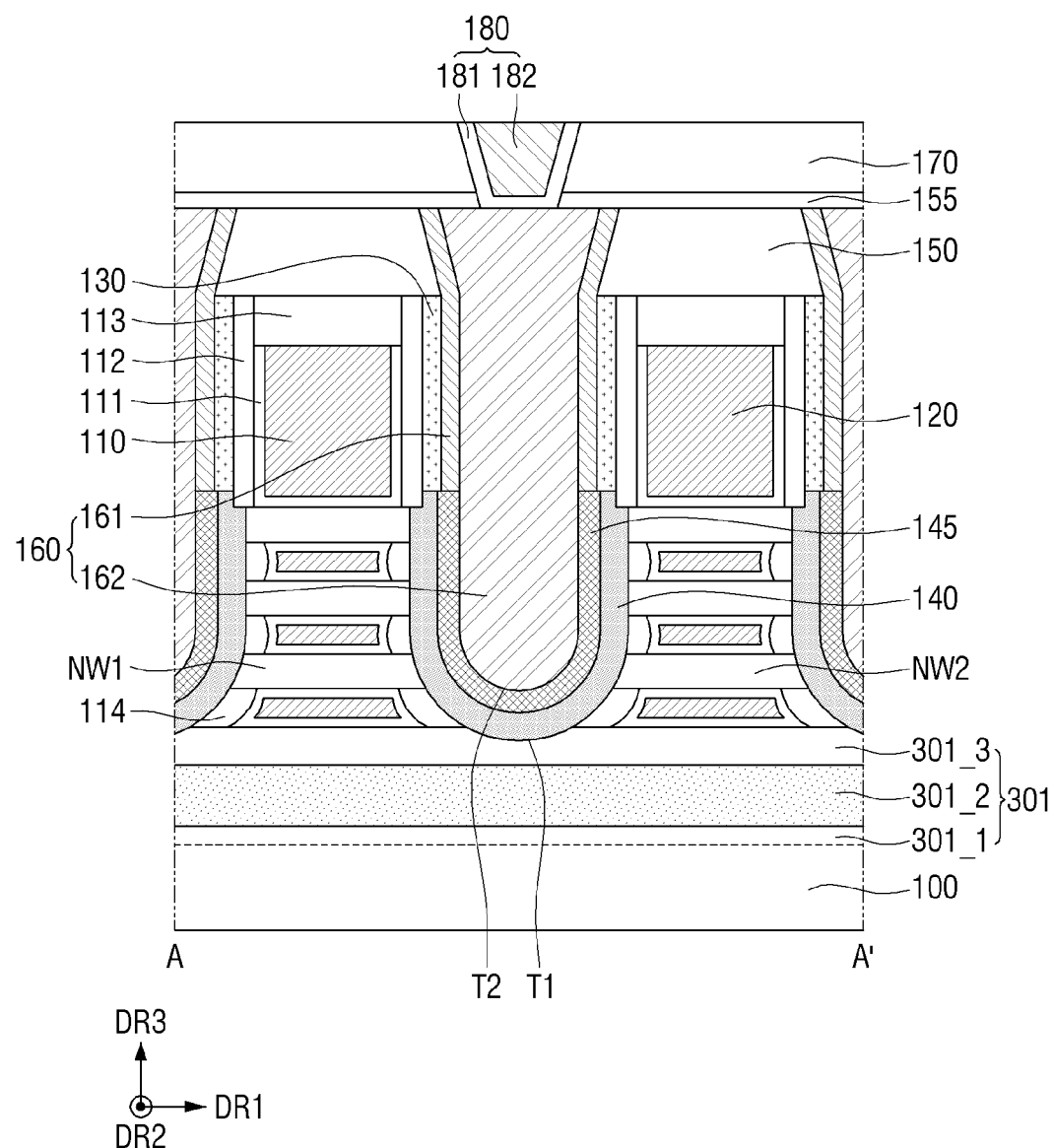
FIG. 22 is a cross-sectional view illustrating a semiconductor device according to still other embodiments of the present disclosure.

FIG. 22 is a cross-sectional view illustrating a semiconductor device according to still other embodiments of the present disclosure.

Referring to FIG. 22, a semiconductor device according to still other embodiments of the present disclosure may include a silicon on insulator (SOI) substrate. For example, a first active pattern 301 may include a first layer 301_1, an insulating layer 301_2, and a second layer 301_3. The SOI substrate may be defined as including the substrate 100 and the first active pattern 301.

The first layer 301_1 may be disposed on the substrate 100. The first layer 301_1 may include, for example, silicon (Si) or silicon germanium (SiGe). The insulating layer 301_2 may be disposed on the first layer 301_1. The insulating layer 301_2 may include an insulating material. The insulating layer 301_2 may include, for example, silicon oxide (Sift), but the present disclosure is not limited thereto. The second layer 301_3 may be on the insulating layer 301_2. The second layer 301_3 may include, for example, silicon (Si). For example, at least a part of the source/drain region 140 may be disposed inside the second layer 301_3. However, the present disclosure is not limited thereto.

Hereinafter, a semiconductor device according to still other embodiments of the present disclosure will be described with reference to FIG. 23. Differences from the semiconductor device shown in FIGS. 1 to 5 will be mainly described.

Figure 23:
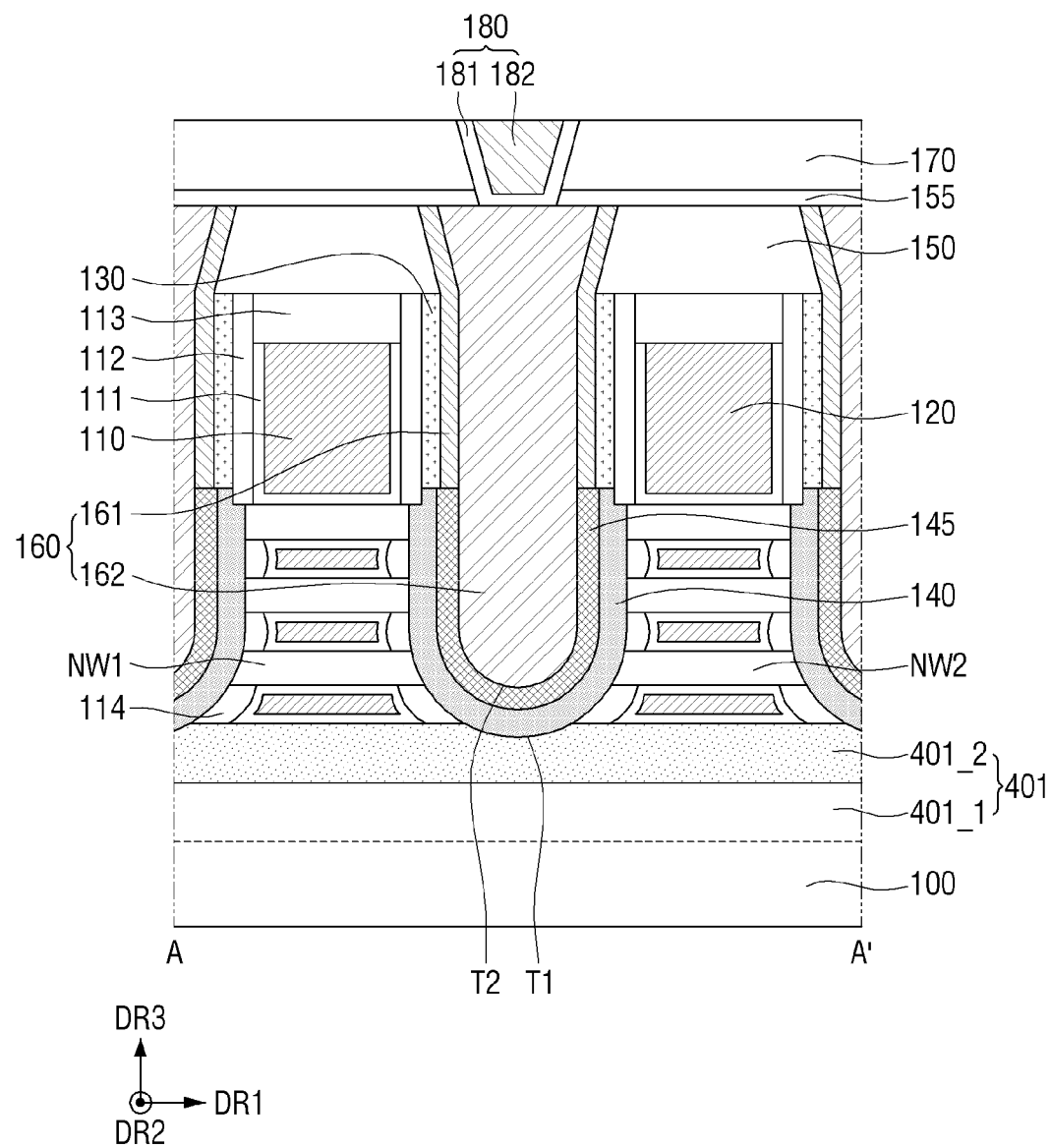
FIG. 23 is a cross-sectional view illustrating a semiconductor device according to still other embodiments of the present disclosure.

FIG. 23 is a cross-sectional view illustrating a semiconductor device according to still other embodiments of the present disclosure.

Referring to FIG. 23, a semiconductor device according to still other embodiments of the present disclosure may include a silicon-germanium on insulator (SGOI) substrate. For example, a first active pattern 401 may include a first layer 401_1 and an insulating layer 401_2. The SGOI substrate may be defined as including the substrate 100 and the first active pattern 401.

The first layer 401_1 may be disposed on the substrate 100. The first layer 401_1 may include, for example, silicon germanium (SiGe). The insulating layer 401_2 may be disposed on the first layer 401_1. The insulating layer 401_2 may include an insulating material. The insulating layer 401_2 may include, for example, silicon oxide ($SiO_2$), but the present disclosure is not limited thereto. For example, at least a part of the source/drain region 140 may be disposed inside the insulating layer 401_2. However, the present disclosure is not limited thereto.

Hereinafter, a semiconductor device according to still other embodiments of the present disclosure will be described with reference to FIG. 24. Differences from the semiconductor device shown in FIGS. 1 to 5 will be mainly described.

Figure 24:
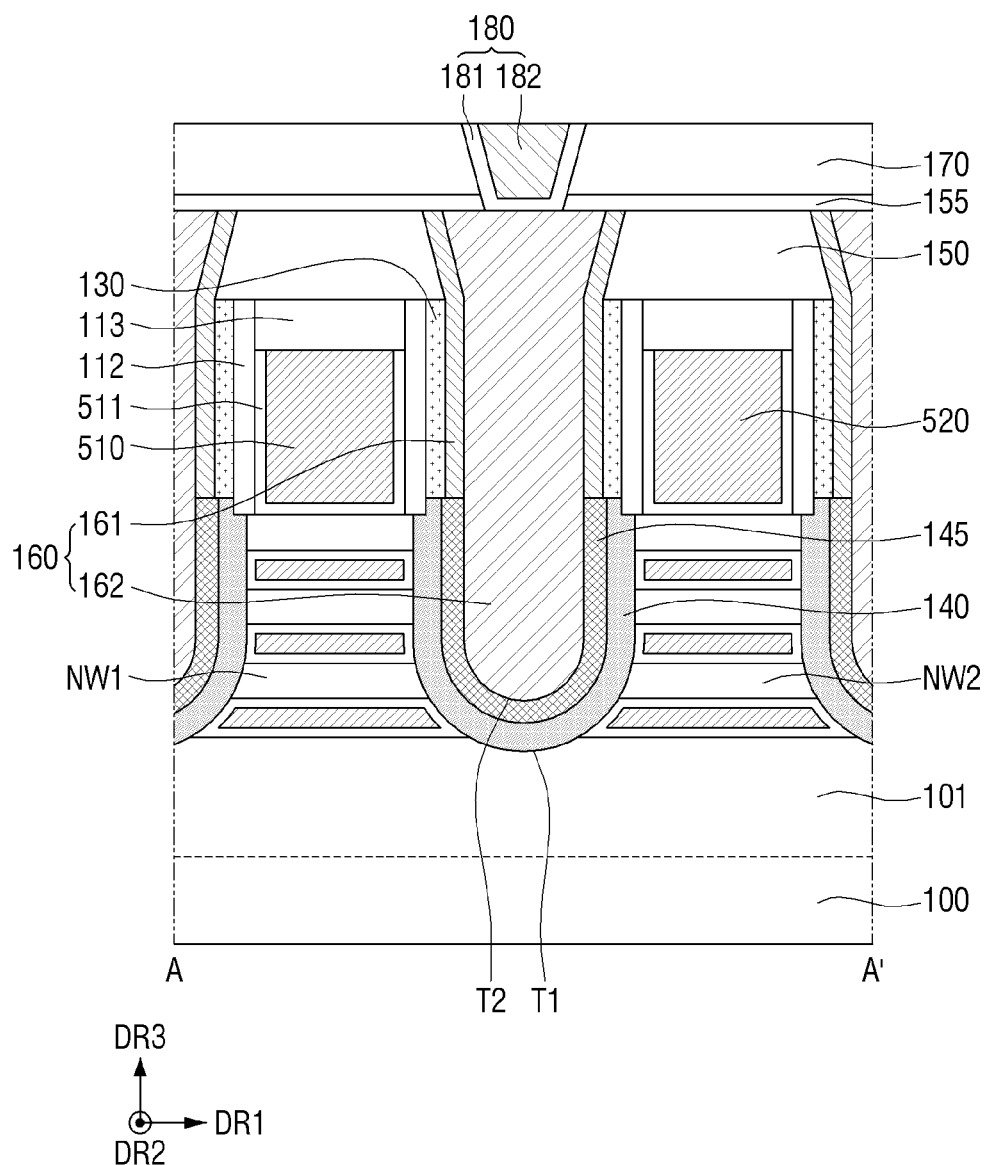
FIG. 24 is a cross-sectional view illustrating a semiconductor device according to some other embodiments of the present disclosure.

FIG. 24 is a cross-sectional view illustrating a semiconductor device according to some other embodiments of the present disclosure.

Referring to FIG. 24, in a semiconductor device according to still other embodiments of the present disclosure, the internal spacer 114 (see FIG. 2) is not provided.

The width in the first horizontal direction DR1 of a first portion of a first gate electrode 510 disposed between the first plurality of nanosheets NW1 may be greater than the width in the horizontal direction DR1 of a second portion of the first gate electrode 510 disposed between the external spacers 112. In addition, the width in the first horizontal direction DR1 of a first portion of a second gate electrode 520 disposed between the second plurality of nanosheets NW2 may be greater than the width in the horizontal direction DR1 of a second portion of the second gate electrode 520 disposed between the external spacers 112. A gate insulating layer 511 may be in contact with the source/drain region 140.

Hereinafter, a semiconductor device according to still other embodiments of the present disclosure will be described with reference to FIG. 25. Differences from the semiconductor device shown in FIGS. 1 to 5 will be mainly described.

Figure 25:
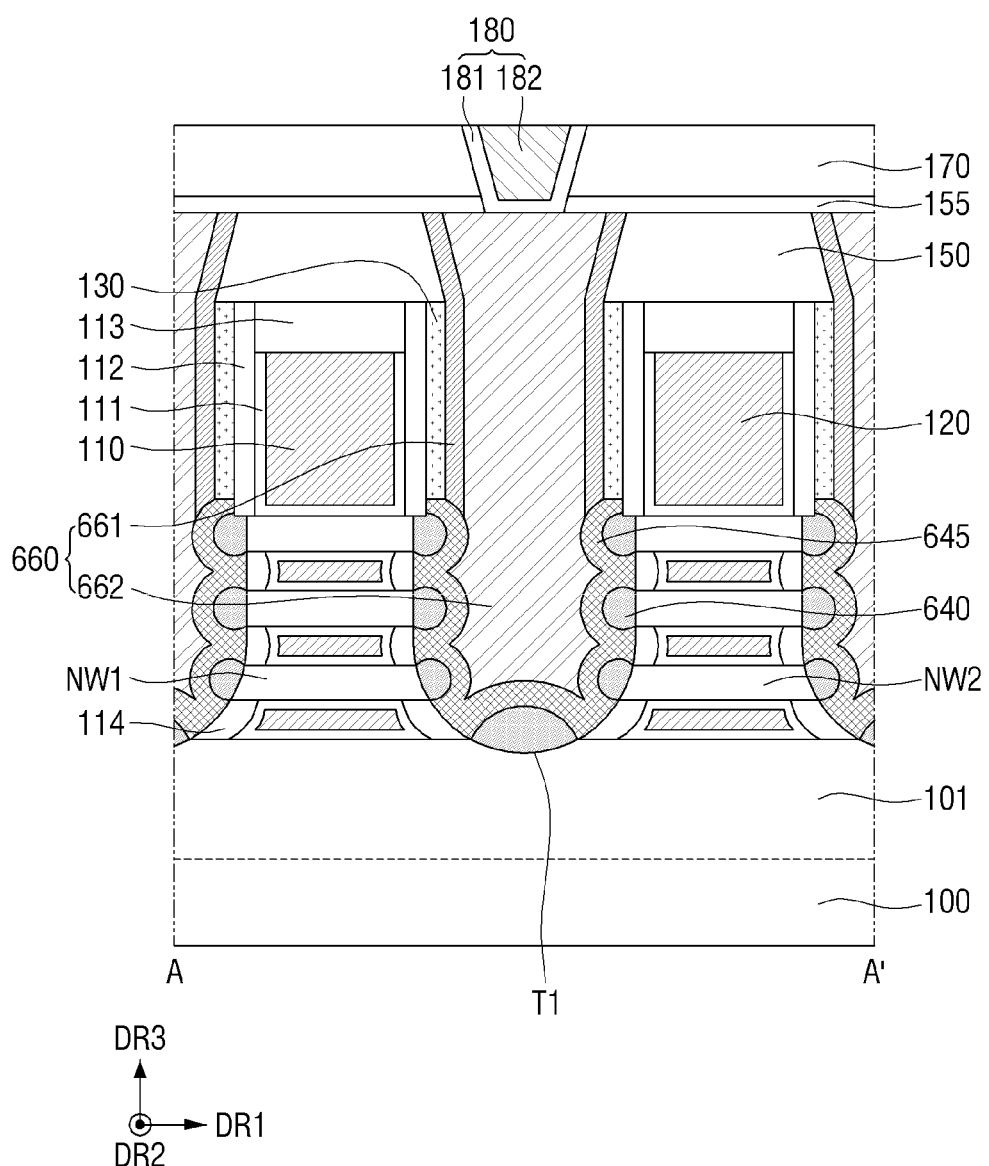
FIG. 25 is a cross-sectional view illustrating a semiconductor device according to still other embodiments of the present disclosure.

FIG. 25 is a cross-sectional view illustrating a semiconductor device according to still other embodiments of the present disclosure.

Referring to FIG. 25, in a semiconductor device according to still other embodiments of the present disclosure, a silicide layer 645 may be in contact with the internal spacer 114.

Source/drain regions 640 may be disposed on opposite sides of the first plurality of nanosheets NW1. The source/drain regions 640 may be disposed to protrude convexly in the first horizontal direction DR1 from the first plurality of nanosheets NW1. The source/drain regions 640 may be disposed on opposite sides of the second plurality of nanosheets NW2. The source/drain regions 640 may be disposed to protrude convexly in the first horizontal direction DR1 from the second plurality of nanosheets NW2. Moreover, some of the source/drain regions 640 may be disposed to protrude convexly in the vertical direction DR3 from the first active pattern 101.

In some embodiments, first ones of the source/drain regions 640 in contact with the first plurality of nanosheets NW1 may be spaced apart from each other in the vertical direction DR3. In addition, second ones of the source/drain regions 640 in contact with the second plurality of nanosheets NW2 may be spaced apart from each other in the vertical direction DR3.

The silicide layer 645 may be disposed between a first filling layer 662 and the source/drain regions 640. A first barrier layer 661 is not disposed between the silicide layer 645 and the first filling layer 662. The silicide layer 645 may be in contact with the internal spacer 114 between the source/drain regions 640.

Hereinafter, a semiconductor device according to some other embodiments of the present disclosure will be described with reference to FIGS. 26 and 27. Differences from the semiconductor device shown in FIGS. 1 to 5 will be mainly described.

Figure 26:
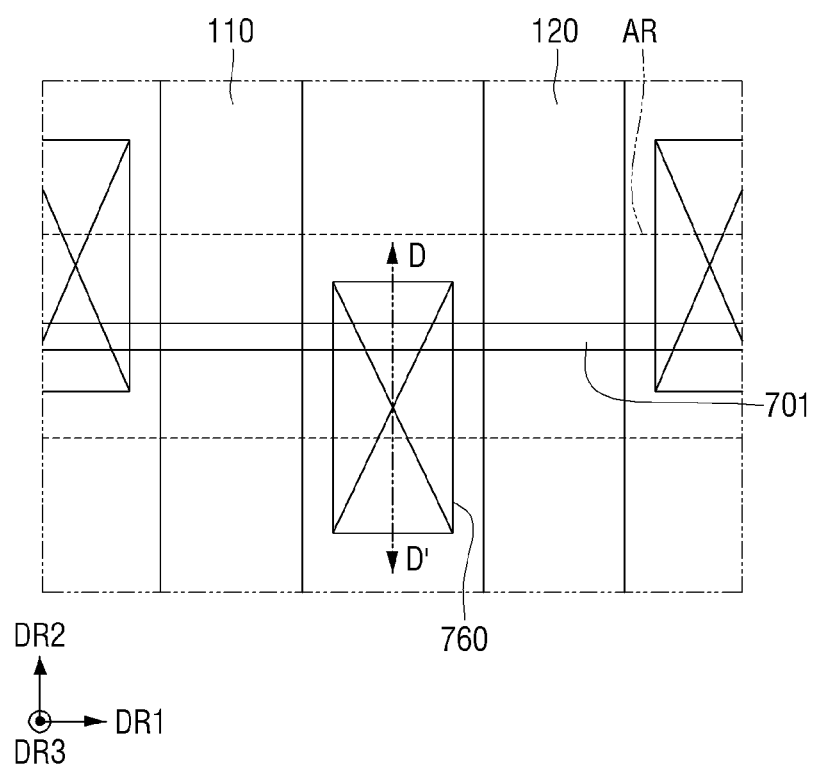
FIG. 26 is a layout diagram illustrating a semiconductor device according to still other embodiments of the present disclosure.

FIG. 26 is a layout diagram illustrating a semiconductor device according to still other embodiments of the present disclosure. FIG. 27 is a cross-sectional view taken along line D-D' of FIG. 26.

Figure 27:
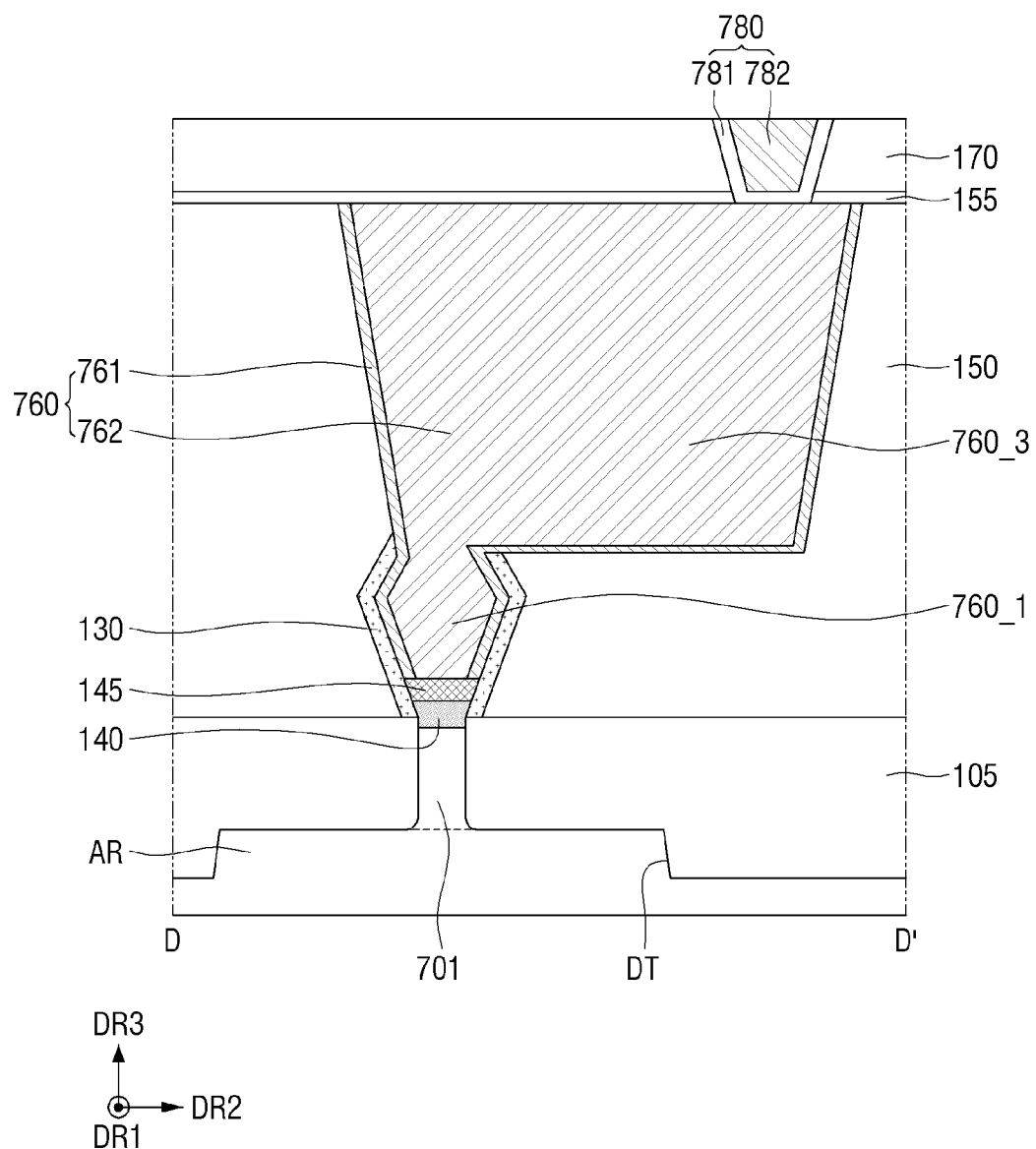
FIG. 27 is a cross-sectional view taken along line D-D' of FIG. 26.

Referring to FIGS. 26 and 27, in a semiconductor device according to still other embodiments of the present disclosure, a source/drain contact 760 may extend onto an element isolation region defined by the deep trench DT. That is, the source/drain contact 760 may be disposed across the active region AR and the element isolation region.

An active pattern 701 may extend in the first horizontal direction DR1 on the active region AR. In FIG. 26, one active pattern 701 is shown to be disposed on the active region AR, but the present disclosure is not limited thereto. In some other embodiments, two or more active patterns may be disposed on the active region AR.

The source/drain contact 760 may include a first portion 760_1 and a second portion 760_3. For example, the first portion 760_1 of the source/drain contact 760 may be disposed on the active pattern 701.

As shown in FIG. 26, in the cross-sectional view taken along the second horizontal direction DR2, the bottom and top surfaces of the first portion 760_1 of the source/drain contact 760 may be formed to have widths smaller than the width of the central portion of the first portion 760_1. Such a shape of the first portion 760_1 of the source/drain contact 760 is caused by etching the source/drain region 140 to form the first portion 760_1 of the source/drain contact 760.

The second portion 760_3 of the source/drain contact 760 may be disposed on the first portion 760_1 of the source/drain contact 760. The second portion 760_3 of the source/drain contact 760 may be in contact with the first portion 760_1 of the source/drain contact 760. The second portion 760_3 of the source/drain contact 760 may be disposed across the active region AR and the element isolation region.

The source/drain contact 760 may include a first barrier layer 761 and a first filling layer 762 disposed on the first barrier layer 761.

A via 780 may penetrate the second interlayer insulating layer 170 and the etch stop layer 155 in the vertical direction DR3 to be connected (e.g., electrically connected) to the source/drain contact 760. The via 780 may be disposed on the element isolation region defined by the deep trench DT.

The via 780 may include a second barrier layer 781 and a second filling layer 782. The second barrier layer 781 may form the sidewall and the bottom surface of the via 780. The second filling layer 782 may be disposed on the second barrier layer 781.

In concluding the detailed description, those skilled in the art will appreciate that many variations and modifications can be made to the example embodiments without substantially departing from the principles of the present disclosure. Therefore, the disclosed example embodiments of the invention are used in a generic and descriptive sense only and not for purposes of limitation.

What is claimed is:

1. A semiconductor device comprising:
   a substrate;
   an active pattern extending in a first horizontal direction on the substrate;
   a gate electrode extending in a second horizontal direction different from the first horizontal direction on the active pattern;
   a source/drain region on at least one side of the gate electrode;
   a source/drain contact extending into the source/drain region and including a filling layer and a barrier layer along a sidewall of the filling layer; and
   a silicide layer between the source/drain region and the filling layer, the silicide layer including a first sidewall in contact with the filling layer and a second sidewall in contact with the source/drain region,
   wherein the barrier layer is not between the filling layer and the source/drain region, and
   wherein the filling layer is formed as a single film, and the filling layer is in contact with the barrier layer.

2. The semiconductor device of claim 1,
   wherein the barrier layer includes a first sidewall in contact with the filling layer and a second sidewall opposite to the first sidewall, and
   wherein the first sidewall of the barrier layer extends from the first sidewall of the silicide layer.

3. The semiconductor device of claim 1, wherein an uppermost surface of the silicide layer is in contact with a lowermost surface of the barrier layer.

4. The semiconductor device of claim 1, further comprising:
   an interlayer insulating layer on a sidewall of the source/drain contact; and
   a liner layer between the source/drain contact and the gate electrode,
   wherein the liner layer is in contact with each of an uppermost surface of the source/drain region and an uppermost surface of the silicide layer.

5. The semiconductor device of claim 1, further comprising:
   an interlayer insulating layer on a sidewall of the source/drain contact,
   wherein the interlayer insulating layer is not between the gate electrode and the source/drain contact.

6. The semiconductor device of claim 1, wherein the source/drain contact includes:
   a first portion;
   a second portion spaced apart from the first portion in the second horizontal direction; and
   a third portion on the first and second portions and electrically connecting the first portion to the second portion.

7. The semiconductor device of claim 1, wherein the active pattern includes:
   a first layer on the substrate and comprising silicon (Si) or silicon germanium (SiGe); and
   an insulating layer on the first layer and comprising an insulating material.

8. The semiconductor device of claim 7, wherein the active pattern further includes:
   a second layer on the insulating layer and comprising silicon (Si).

9. The semiconductor device of claim 1, further comprising a plurality of nanosheets stacked to be spaced apart from each other in a vertical direction on the active pattern and surrounded by the gate electrode.

10. The semiconductor device of claim 9, further comprising a gate insulating layer between the gate electrode and the source/drain region and in contact with the source/drain region.

11. The semiconductor device of claim 9, further comprising an internal spacer on opposite sides of the gate electrode between the plurality of nanosheets,
wherein the internal spacer is in contact with the silicide layer.

12. A semiconductor device, comprising:
a substrate;
an active pattern extending in a first horizontal direction on the substrate;
a plurality of nanosheets stacked to be spaced apart from each other in a vertical direction on the active pattern;
a gate electrode extending in a second horizontal direction different from the first horizontal direction on the active pattern and surrounding the plurality of nanosheets;
a source/drain region on at least one side of the gate electrode;
a source/drain contact extending into the source/drain region and including a filling layer and a barrier layer along a sidewall of the filling layer;
a silicide layer between the source/drain region and the filling layer, including a first sidewall in contact with the filling layer and a second sidewall in contact with the source/drain region, and having an uppermost surface in contact with the barrier layer;
an interlayer insulating layer on a sidewall of the source/drain contact; and
a liner layer between the source/drain contact and the gate electrode and between the source/drain contact and the interlayer insulating layer,
wherein the barrier layer includes a first sidewall in contact with the filling layer and a second sidewall opposite to the first sidewall,
wherein the first sidewall of the barrier layer extends from the first sidewall of the silicide layer, and
wherein the filling layer is formed as a single film.

13. The semiconductor device of claim 12, wherein the barrier layer is not between the filling layer and the source/drain region.

14. The semiconductor device of claim 12, wherein the liner layer is in contact with each of an uppermost surface of the source/drain region and the uppermost surface of the silicide layer.

15. The semiconductor device of claim 12, wherein the source/drain contact includes:
a first portion;
a second portion spaced apart from the first portion in the second horizontal direction; and
a third portion on the first and second portions and electrically connecting the first portion to the second portion, and
wherein the interlayer insulating layer is between the first portion and the second portion.

16. A method for fabricating a semiconductor device, the method comprising:
forming a stacked structure in which a first semiconductor layer and a second semiconductor layer are alternately stacked on a substrate;
forming a dummy gate on the stacked structure;
forming a trench by etching the stacked structure using the dummy gate as a mask;
forming a source/drain region in the trench;
forming a sacrificial layer on the source/drain region in the trench;
forming a liner material layer on a sidewall of the dummy gate and on the sacrificial layer;
removing the dummy gate and the first semiconductor layer;
forming a gate electrode in regions from which the dummy gate and the first semiconductor layer are removed;
forming a liner layer on a sidewall of the gate electrode by removing a part of the liner material layer formed on the sacrificial layer;
removing the sacrificial layer to expose the source/drain region;
forming a barrier material layer along a profile of each of the source/drain region and a sidewall of the liner layer, after the removing of the sacrificial layer;
forming a silicide layer by heat-treating a part of the barrier material layer in contact with the source/drain region; and
forming a filling layer on the silicide layer.

17. The method of claim 16, wherein a sidewall of the barrier material layer in contact with the filling layer extends from a sidewall of the silicide layer in contact with the filling layer.

18. The method of claim 16, wherein the removing of the sacrificial layer to expose the source/drain region comprises removing the sacrificial layer such that the sidewall of the liner layer and a sidewall of the source/drain region collectively form a continuous line.

19. The method of claim 16,
wherein the source/drain region includes either silicon (Si) or silicon germanium (SiGe) comprising germanium (Ge) having a first concentration, and
wherein the sacrificial layer includes SiGe comprising Ge having a second concentration higher than the first concentration.

20. The method of claim 16,
wherein the source/drain region includes silicon germanium (SiGe) comprising germanium (Ge) having a first concentration, and
wherein the sacrificial layer includes either silicon (Si) or SiGe comprising Ge having a second concentration lower than the first concentration.

* * * * *